US008058142B2

(12) United States Patent
Lee

(10) Patent No.: US 8,058,142 B2
(45) Date of Patent: Nov. 15, 2011

(54) BONDED SEMICONDUCTOR STRUCTURE AND METHOD OF MAKING THE SAME

(75) Inventor: Sang-Yun Lee, Beaverton, OR (US)

(73) Assignee: BeSang Inc., Beaverton, OR (US)

( * ) Notice: Subject to any disclaimer, the term of this patent is extended or adjusted under 35 U.S.C. 154(b) by 352 days.

(21) Appl. No.: 12/470,344

(22) Filed: May 21, 2009

(65) Prior Publication Data

US 2009/0267233 A1  Oct. 29, 2009

Related U.S. Application Data

(63) Continuation-in-part of application No. 12/040,642, filed on Feb. 29, 2008, now Pat. No. 7,800,199, and a continuation-in-part of application No. 11/873,851, filed on Oct. 17, 2007, now Pat. No. 7,718,508, and a continuation-in-part of application No. 11/873,769, filed on Oct. 17, 2007, and a continuation-in-part of application No. 11/873,719, filed on Oct. 17, 2007, and a continuation-in-part of application No. 11/606,523, filed on Nov. 30, 2006, now Pat. No. 7,888,764, and a continuation-in-part of application No. 11/378,059, filed on Mar. 17, 2006, and a continuation-in-part of application No. 11/180,286, filed on Jul. 12, 2005, and a continuation-in-part of application No. 11/092,521, filed on Mar. 29, 2005, now Pat. No. 7,633,162, and a continuation-in-part of application No. 11/092,501, filed on Mar. 29, 2005, and a continuation-in-part of application No. 11/092,500, filed on Mar. 29, 2005, now Pat. No. 8,018,058, and a continuation-in-part of application No. 11/092,499, filed on Mar. 29, 2005, now Pat. No. 7,470,598, and a continuation-in-part of application No. 11/092,498, filed on Mar. 29, 2005, now Pat. No. 7,470,142, and a continuation-in-part of application No. 10/873,969, filed on Jun. 21, 2004, now Pat. No. 7,052,941.

(30) Foreign Application Priority Data

| Jun. 24, 2003 | (KR) | 10-2003-0040920 |
|---|---|---|
| Jul. 12, 2003 | (KR) | 10-2003-0047515 |
| May 21, 2008 | (KR) | 10-2008-0046991 |

(51) Int. Cl.
*H01L 21/30* (2006.01)
(52) U.S. Cl. ................ 438/455; 257/E23.145
(58) Field of Classification Search .......... 257/E23.011, 257/E23.145; 438/637, 455
See application file for complete search history.

(56) References Cited

U.S. PATENT DOCUMENTS

| 4,704,785 A | 11/1987 | Curran |
| 4,732,312 A | 3/1988 | Kennedy et al. |
| 4,829,018 A | 5/1989 | Wahlstrom |
| 4,854,986 A | 8/1989 | Raby |
| 4,939,568 A | 7/1990 | Kato et al. |
| 5,047,979 A | 9/1991 | Leung |

(Continued)

*Primary Examiner* — Thao Le
(74) *Attorney, Agent, or Firm* — Schmeiser Olsen & Watts LLP

(57) ABSTRACT

A bonded semiconductor structure static random access memory circuit includes a support substrate which carries a first horizontally oriented transistor, and an interconnect region which includes a conductive line. The memory circuit includes a donor substrate which includes a semiconductor layer stack coupled to a donor substrate body region through a detach region, wherein the semiconductor layer stack is coupled to the interconnect region through a bonding interface, and wherein the semiconductor layer stack includes a pn junction.

20 Claims, 14 Drawing Sheets

U.S. PATENT DOCUMENTS

| | | |
|---|---|---|
| 5,087,585 A | 2/1992 | Hayashi |
| 5,093,704 A | 3/1992 | Saito et al. |
| 5,106,775 A | 4/1992 | Kaga et al. |
| 5,152,857 A | 10/1992 | Ito et al. |
| 5,250,460 A | 10/1993 | Yamagata et al. |
| 5,265,047 A | 11/1993 | Leung et al. |
| 5,266,511 A | 11/1993 | Takao |
| 5,277,748 A | 1/1994 | Sakaguchi et al. |
| 5,308,782 A | 5/1994 | Mazure et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,554,870 A | 9/1996 | Fitch et al. |
| 5,563,084 A | 10/1996 | Ramm et al. |
| 5,617,991 A | 4/1997 | Pramanick et al. |
| 5,627,106 A | 5/1997 | Hsu |
| 5,670,411 A * | 9/1997 | Yonehara et al. ............. 438/459 |
| 5,695,557 A * | 12/1997 | Yamagata et al. ............. 117/97 |
| 5,737,748 A | 4/1998 | Shigeeda |
| 5,829,026 A | 10/1998 | Leung et al. |
| 5,835,396 A | 11/1998 | Zhang |
| 5,854,123 A | 12/1998 | Sato et al. |
| 5,882,987 A | 3/1999 | Srikrishnan |
| 5,892,225 A | 4/1999 | Okihara |
| 5,915,167 A | 6/1999 | Leedy |
| 5,937,312 A | 8/1999 | Iyer et al. |
| 5,977,579 A | 11/1999 | Noble |
| 5,980,633 A | 11/1999 | Yamagata et al. |
| 5,998,808 A | 12/1999 | Matsushita |
| 6,009,496 A | 12/1999 | Tsai |
| 6,057,212 A | 5/2000 | Chan et al. |
| 6,103,597 A | 8/2000 | Aspar et al. |
| 6,153,495 A | 11/2000 | Kub et al. |
| 6,222,251 B1 | 4/2001 | Holloway |
| 6,229,161 B1 | 5/2001 | Nemati et al. |
| 6,242,324 B1 | 6/2001 | Kub et al. |
| 6,259,623 B1 | 7/2001 | Takahashi |
| 6,331,468 B1 | 12/2001 | Aronowitz et al. |
| 6,380,046 B1 | 4/2002 | Yamazaki |
| 6,380,099 B2 | 4/2002 | Sakaguchi et al. |
| 6,417,108 B1 | 7/2002 | Akino et al. |
| 6,423,614 B1 | 7/2002 | Doyle |
| 6,531,697 B1 | 3/2003 | Nakamura et al. |
| 6,534,382 B1 | 3/2003 | Sakaguchi et al. |
| 6,535,411 B2 | 3/2003 | Jolin et al. |
| 6,555,901 B1 | 4/2003 | Yoshihara et al. |
| 6,600,173 B2 | 7/2003 | Tiwari |
| 6,621,168 B2 | 9/2003 | Sundahl et al. |
| 6,630,713 B2 | 10/2003 | Geusic |
| 6,635,552 B1 | 10/2003 | Gonzalez |
| 6,638,834 B2 | 10/2003 | Gonzalez |
| 6,653,209 B1 | 11/2003 | Yamagata |
| 6,661,085 B2 | 12/2003 | Kellar et al. |
| 6,677,204 B2 | 1/2004 | Cleeves et al. |
| 6,742,067 B2 | 5/2004 | Hsien |
| 6,751,113 B2 | 6/2004 | Bhakta et al. |
| 6,762,076 B2 | 7/2004 | Kim et al. |
| 6,774,010 B2 | 8/2004 | Chu et al. |
| 6,787,920 B2 | 9/2004 | Amir |
| 6,806,171 B1 | 10/2004 | Ulyashin et al. |
| 6,809,009 B2 | 10/2004 | Aspar et al. |
| 6,822,233 B2 | 11/2004 | Nakamura et al. |
| 6,844,243 B1 | 1/2005 | Gonzalez |
| 6,854,067 B1 | 2/2005 | Kutz et al. |
| 6,864,534 B2 | 3/2005 | Ipposhi et al. |
| 6,943,067 B2 | 9/2005 | Greenlaw |
| 6,943,407 B2 | 9/2005 | Ouyang et al. |
| 6,995,430 B2 | 2/2006 | Langdo et al. |
| 7,002,152 B2 | 2/2006 | Grunewald |
| 7,052,941 B2 | 5/2006 | Lee |
| 7,067,396 B2 | 6/2006 | Aspar et al. |
| 7,078,739 B1 | 7/2006 | Nemati et al. |
| 7,109,092 B2 | 9/2006 | Tong |
| 7,148,119 B1 | 12/2006 | Sakaguchi et al. |
| RE39,484 E | 2/2007 | Bruel |
| 7,217,636 B1 | 5/2007 | Atanackovic |
| 7,245,002 B2 | 7/2007 | Akino et al. |
| 7,256,104 B2 | 8/2007 | Ito et al. |
| 7,338,884 B2 * | 3/2008 | Shimoto et al. ............... 438/459 |
| 7,378,702 B2 | 5/2008 | Lee |
| 7,470,142 B2 | 12/2008 | Lee |
| 7,470,598 B2 | 12/2008 | Lee |
| 7,632,738 B2 | 12/2009 | Lee |
| 7,633,162 B2 | 12/2009 | Lee |
| 7,671,371 B2 | 3/2010 | Lee |
| 7,709,932 B2 | 5/2010 | Nemoto et al. |
| 7,718,508 B2 | 5/2010 | Lee |
| 7,799,675 B2 | 9/2010 | Lee |
| 7,800,199 B2 | 9/2010 | Oh et al. |
| 7,846,814 B2 | 12/2010 | Lee |
| 7,867,822 B2 | 1/2011 | Lee |
| 7,888,764 B2 | 2/2011 | Lee |
| 2002/0024140 A1 | 2/2002 | Nakajima et al. |
| 2002/0025604 A1 | 2/2002 | Tiwari |
| 2002/0141233 A1 | 10/2002 | Hosotani et al. |
| 2003/0067043 A1 | 4/2003 | Zhang |
| 2003/0102079 A1 | 6/2003 | Kalvesten et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0205480 A1 | 11/2003 | Sakaguchi et al. |
| 2003/0224582 A1 | 12/2003 | Shimoda et al. |
| 2004/0113207 A1 | 6/2004 | Hsu et al. |
| 2004/0131233 A1 | 7/2004 | Comaniciu et al. |
| 2004/0147077 A1 | 7/2004 | Watanabe et al. |
| 2004/0155301 A1 | 8/2004 | Zhang |
| 2004/0156233 A1 | 8/2004 | Bhattacharyya |
| 2004/0160849 A1 | 8/2004 | Rinerson et al. |
| 2004/0259312 A1 | 12/2004 | Schlosser et al. |
| 2005/0280154 A1 | 12/2005 | Lee |
| 2005/0280155 A1 | 12/2005 | Lee |
| 2005/0280156 A1 | 12/2005 | Lee |
| 2006/0121690 A1 | 6/2006 | Pogge et al. |
| 2006/0275962 A1 | 12/2006 | Lee |
| 2007/0072391 A1 | 3/2007 | Pocas et al. |
| 2007/0190746 A1 | 8/2007 | Ito et al. |
| 2007/0262457 A1 | 11/2007 | Lin |
| 2008/0032463 A1 | 2/2008 | Lee |
| 2008/0048327 A1 | 2/2008 | Lee |
| 2009/0267233 A1 | 10/2009 | Lee |
| 2010/0038743 A1 | 2/2010 | Lee |
| 2010/0133695 A1 | 6/2010 | Lee |
| 2010/0190334 A1 | 7/2010 | Lee |
| 2011/0001172 A1 | 1/2011 | Lee |
| 2011/0003438 A1 | 1/2011 | Lee |
| 2011/0053332 A1 | 3/2011 | Lee |

* cited by examiner

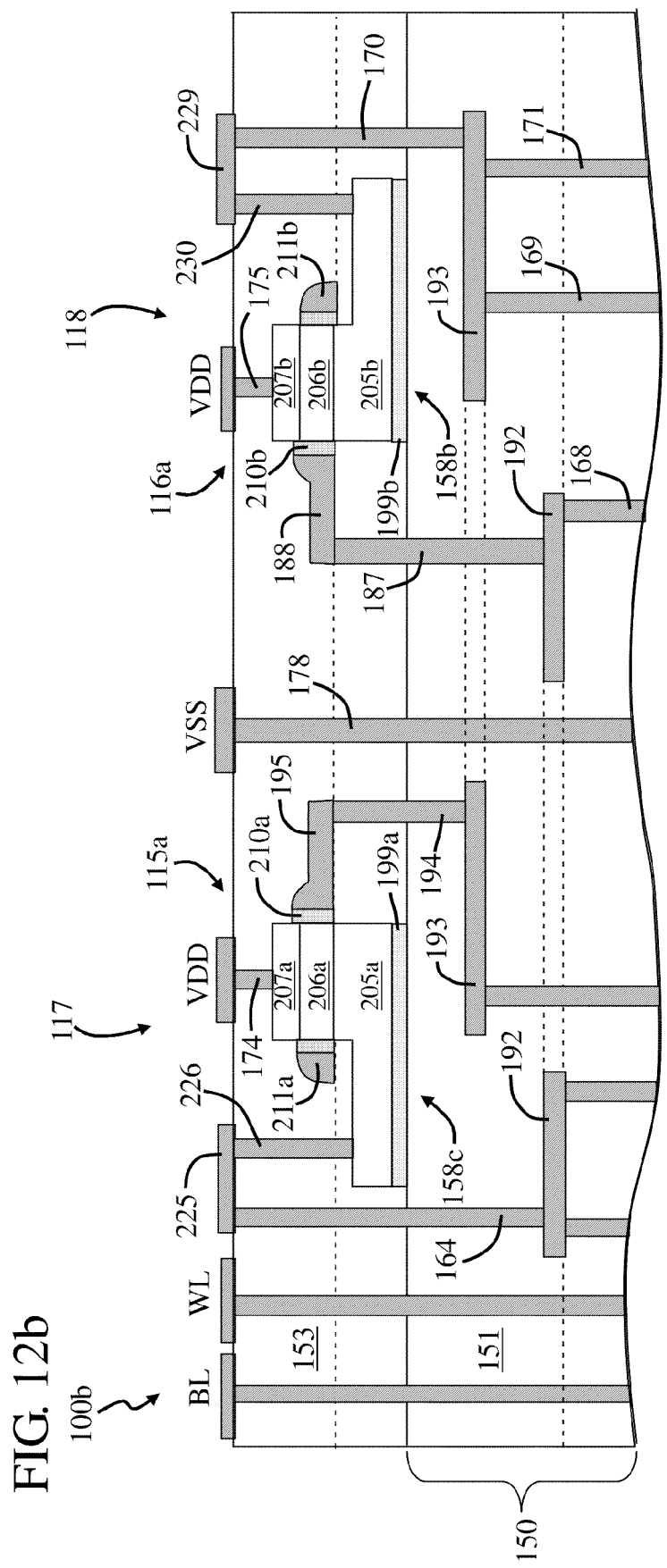

BONDED SEMICONDUCTOR STRUCTURE AND METHOD OF MAKING THE SAME

CROSS-REFERENCE TO RELATED APPLICATIONS

This application claims the benefit of Korean Patent Application No. 10-2008-0046991, filed on May 21, 2008, the contents of which are incorporated herein by reference.

This application is a continuation-in-part of, and claims the benefit of, U.S. Patent Application Nos.:
Ser. No. 12/040,642, filed on Feb. 29, 2008,
Ser. No. 11/092,498, filed on Mar. 29, 2005, now U.S. Pat. No. 7,470,142,
Ser. No. 11/092,499, filed on Mar. 29, 2005, now U.S. Pat. No. 7,470,598,
Ser. No. 11/092,500, filed on Mar. 29, 2005,
Ser. No. 11/092,501, filed on Mar. 29, 2005;
Ser. No. 11/092,521, filed on Mar. 29, 2005;
Ser. No. 11/180,286, filed on Jul. 12, 2005;
Ser. No. 11/378,059, filed on Mar. 17, 2006; and
Ser. No. 11/606,523, filed on Nov. 30, 2006;
which in turn are continuation-in-parts of, and claim the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of all of which are incorporated herein by reference in their entirety.

This is also a continuation-in-part of, and claims the benefit of, U.S. Patent Application Nos.:
Ser. No. 11/873,719, filed on Oct. 17, 2007; and
Ser. No. 11/873,851, filed on Oct. 17, 2007;
which in turn are divisionals of, and claim the benefit of, U.S. patent application Ser. No. 10/092,521, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

This is also a continuation-in-part of, and claims the benefit of, U.S. patent application Ser. No. 11/873,769, filed on Oct. 17, 2007, which in turn is a divisional of, and claims the benefit of, U.S. patent application Ser. No. 10/092,500, which is a continuation-in-part of, and claims the benefit of, U.S. patent application Ser. No. 10/873,969 (now U.S. Pat. No. 7,052,941), filed on Jun. 21, 2004, which claims the benefit of Republic of Korea Patent Application Nos. 10-2003-0040920 and 10-2003-0047515, filed on Jun. 24, 2003 and Jul. 12, 2003, respectively, the contents of both of which are incorporated herein by reference in their entirety.

BACKGROUND OF THE INVENTION

1. Field of the Invention

This invention relates to bonded semiconductor structures formed using bonding.

2. Description of the Related Art

Advances in semiconductor manufacturing technology have provided computer systems with integrated circuits that include many millions of active and passive electronic devices, along with the interconnects to provide the desired circuit connections. A typical computer system includes a computer chip, with processor and control circuits, and an external memory chip. As is well-known, most integrated circuits include laterally oriented active and passive electronic devices that are carried on a single major surface of a substrate. The current flow through laterally oriented devices is generally parallel to the single major surface of the substrate. Active devices typically include transistors and passive devices typically include resistors, capacitors, and inductors. However, these laterally oriented devices consume significant amounts of chip area. Sometimes laterally oriented devices are referred to as planar or horizontal devices. Examples of laterally oriented devices can be found in U.S. Pat. Nos. 6,600,173 to Tiwari, 6,222,251 to Holloway and 6,331,468 to Aronowitz.

Vertically oriented devices extend in a direction that is generally perpendicular to the single major surface of the substrate. The current flow through vertically oriented devices is generally perpendicular to the single major surface of the substrate. Hence, the current flow through a vertically oriented semiconductor device is generally perpendicular to the current flow through a horizontally oriented semiconductor device. Examples of vertically oriented semiconductor device can be found in U.S. Pat. Nos. 5,106,775 to Kaga, 6,229,161 to Nemati and 7,078,739 to Nemati.

It should be noted that U.S. Pat. Nos. 5,554,870 to Fitch, 6,229,161 to Nemati and 7,078,739 to Nemati disclose the formation of both horizontal and vertical semiconductor devices on a single major surface of a substrate. However, forming both horizontal and vertical semiconductor devices on a single major surface of a substrate complicates the processing steps because the masks and processing steps needed are not compatible.

Some references disclose forming an electronic device, such as a dynamic random access memory (DRAM) capacitor, by crystallizing polycrystalline and/or amorphous semiconductor material using a laser. One such electronic device is described in U.S. patent Application No. 20040156233 to Bhattacharyya. The laser is used to heat the polycrystalline or amorphous semiconductor material to form a single crystalline semiconductor material. However, a disadvantage of this method is that the laser is capable of driving the temperature of the semiconductor material to be greater than 800 degrees Celsius (° C.). In some situations, the temperature of the semiconductor material is driven to be greater than about 1000° C. It should be noted that some of this heat undesirably flows to other regions of the semiconductor structure proximate to the DRAM capacitor, which can cause damage.

Another type of semiconductor memory is referred to as a static random access memory (SRAM) circuit. There are many different circuits that operate as SRAM memory circuits, with examples being disclosed in U.S. Pat. Nos. 5,047,979, 5,265,047 and 6,259,623. Some SRAM memory circuits include four transistors per unit cell, and others include six transistors per unit cell. In general, an SRAM memory circuit occupies more area as the number of transistors it includes increases. Hence, an SRAM memory circuit having six transistors generally occupies more area than an SRAM memory circuit having four transistors.

The transistors of many SRAM memory circuits are metal oxide field effect (MOSFET) transistors, which can be n-channel or p-channel. An n-channel MOSFET is typically referred to as an NMOS transistor and a p-channel MOSFET is typically referred to as a PMOS transistor. SRAM memory circuits are complementary metal oxide semiconductor (CMOS) circuits when they include NMOS and PMOS transistors connected together. A substrate which carries a CMOS circuit requires a p-type well and an n-type well, wherein the p-type well is used to from the NMOS transistors and the n-type well is used to form the PMOS transistors. The p-type well and n-type well are spaced apart from each other, which undesirably increases the area occupied by the CMOS circuit. Accordingly, it is highly desirable to provide an SRAM circuit which occupies less area.

BRIEF SUMMARY OF THE INVENTION

The present invention is directed to bonded semiconductor structures. The novel features of the invention are set forth with particularity in the appended claims. The invention will be best understood from the following description when read in conjunction with the accompanying drawings.

BRIEF DESCRIPTION OF THE DRAWINGS

FIGS. 12a, 12b and 13 are side views of different embodiments of a bonded semiconductor structure static random access memory circuit.

DETAILED DESCRIPTION OF THE INVENTION

Figure 1:
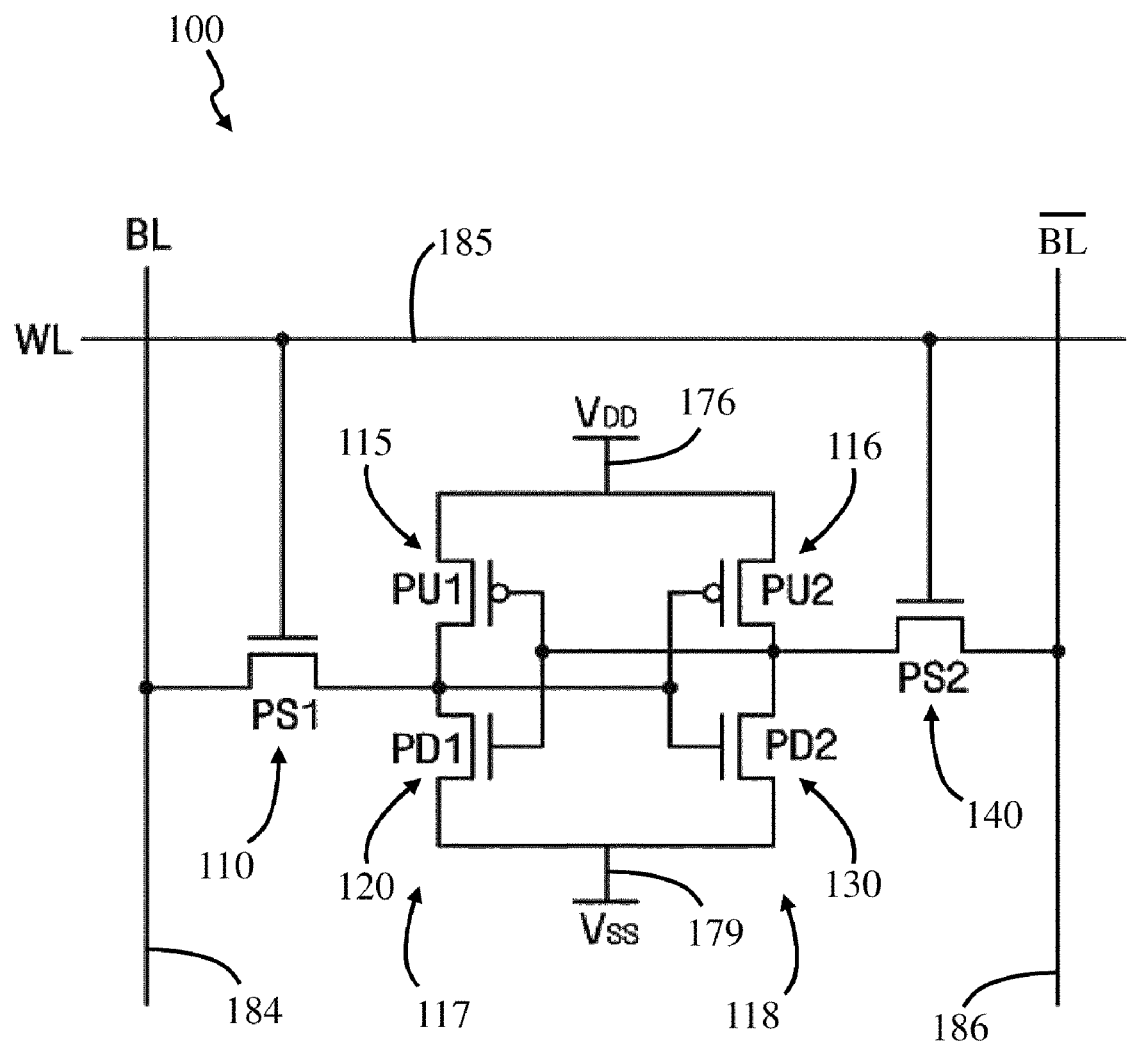
FIG. 1 is a circuit diagram of a bonded semiconductor structure static random access memory circuit.

FIG. 1 is a circuit diagram of a bonded semiconductor structure static random access memory (SRAM) circuit 100. In this embodiment, bonded semiconductor SRAM circuit 100 includes six transistors per SRAM unit cell. However, it should be noted that bonded semiconductor SRAM circuit 100 can include another number of transistors per SRAM unit cell, such as four. It should also be noted that the SRAM unit cell can be repeated a plurality of times to form an array of SRAM unit cells which operate as an SRAM memory array.

Bonded semiconductor structure SRAM circuit 100 is a bonded semiconductor structure because, as discussed in more detail below, it includes a bonding region which bonds an electronic device to an interconnect region through a bonding interface. Other semiconductor structures are not bonded semiconductor structures because they do not include a bonding region which bonds an electronic device through a bonding interface.

In this embodiment, SRAM circuit 100 includes pass transistors 110 and 140, pull-down transistors 120 and 130, and pull-up transistors 115 and 116 connected together so they operate as an SRAM memory circuit. Transistors 110, 115, 116, 120, 130 and 140 can be connected together in many different ways so they operate as an SRAM memory circuit. More information regarding how the transistors of an SRAM circuit can be connected together can be found in U.S. Pat. Nos. 5,047,979, 5,265,047 and 6,259,623. It should be noted that transistors 110, 115, 116, 120, 130 and 140 are connected together with conductive lines, which includes vias and interconnects. More information regarding conductive lines, vias and interconnects is provided below with FIG. 3.

In this embodiment, the transistors of SRAM circuit 100 are embodied as metal oxide field effect transistors (MOSFETs). A MOSFET generally includes a source, drain and control terminal, which is sometimes referred to as a gate electrode. As mentioned in the Background, some MOSFETs are NMOS transistors and other MOSFETs are PMOS transistors. In this embodiment, pull-down transistors 120 and 130 are NMOS transistors, pull-up transistors 115 and 116 are PMOS transistors, and pass transistors 110 and 140 are NMOS transistors. The NMOS and PMOS transistors of SRAM circuit 100 are connected together so that SRAM circuit 100 is a CMOS circuit.

In this embodiment, corresponding sources of pull-down transistors 120 and 130 are connected to a power source $V_{SS}$ through an interconnect 179, and corresponding sources of pull-up transistor 115 and 116 are connected to a power source $V_{DD}$ through an interconnect 176. Corresponding drains of pass transistors 110 and 140 are connected to interconnects 184 and 186, respectively, which operate as bit lines. Interconnect 184 is denoted as BL because it flows a bit line signal, and interconnect 186 corresponds to the complement of interconnect 184, which is denoted as $\overline{BL}$, because it flows the complement of the bit line signal.

The drains of pull-down NMOS transistor 120 and pull-up PMOS transistor 115 are connected together so transistors 115 and 120 operate as an inverter circuit 117. The drains of pull-down NMOS transistor 130 and pull-up PMOS transistor 116 are connected together so transistors 116 and 130 operate as an inverter circuit 118. An output of inverter circuit 117 is connected to an input of inverter circuit 118 as well as to the source of pass transistor 140. An output of inverter circuit 118 is connected to an input of inverter circuit 117 as well as to the source of pass transistor 110. In this way, inverter circuits 117 and 118 are connected together so they operate as a latch circuit.

It should be noted that, in this embodiment, pass transistors 110 and 140 and pull-down transistors 120 and 130 are horizontally oriented NMOS transistors, and pull-up transistors 115 and 116 are vertically oriented PMOS transistors. More information regarding horizontally and vertically oriented devices can be found in the Background. It should also be noted that, in this embodiment, pull-up transistors 115 and 116 are each coupled to an interconnect region through a corresponding bonding interface, as will be discussed in more detail below.

Pass transistors 110 and 140 and pull-down transistors 120 and 130 are horizontally oriented NMOS transistors so that they can be formed in the same p-type well. Further, pull-up transistors 115 and 116 are vertically oriented PMOS transistors which are positioned above the p-type well. Hence, bonded semiconductor structure SRAM circuit 100 can be formed without having to form both a p-type well and an n-type well, as in other CMOS SRAM circuits.

In other embodiments, pass transistors 110 and 140 and pull-down transistors 120 and 130 are horizontally oriented PMOS transistors, and pull-up transistors 115 and 116 are vertically oriented NMOS transistors, wherein transistors 110, 120, 130 and 140 are formed in an n-type well and transistors 115 and 116 are positioned above the n-type well. In this embodiment, bonded semiconductor structure SRAM circuit 100 can be formed without having to form both a p-type well and an n-type well, as in other CMOS SRAM circuits.

FIGS. 2, 3, 4, 5, 6, 7, 8, 9, 10a, 10b and 11 are sectional views of steps in one embodiment of manufacturing bonded semiconductor structure SRAM circuit 100. The formation of a single SRAM unit cell is discussed herein. However, it should be noted that the steps discussed herein can be repeated to form a plurality of SRAM unit cells which operate as an SRAM memory array. In this embodiment, the single SRAM unit cell includes six transistors, as shown in FIG. 1.

Some of the steps of manufacturing SRAM circuit 100 include steps of providing a structure, such as a substrate, interconnect region, etc., and it should be noted that the structure can be provided in many different ways. For example, in some situations, a user provides the structure by manufacturing it and, in other situations, the user provides the structure by acquiring it, such as from a manufacturer. Some of the steps include steps of forming a structure, such as a substrate, interconnect region, conductive line, transistor, etc., and it should be noted that the structure can be formed in many different ways. For example, in some situations, the structure is formed by the user and, in other situations, the structure is formed by someone else and then provided to the user. The structures can be formed in many different ways, such as by growth, deposition, etc. Steps in forming the structures an include steps of etching, as well as some of the steps mentioned below.

Figure 2:
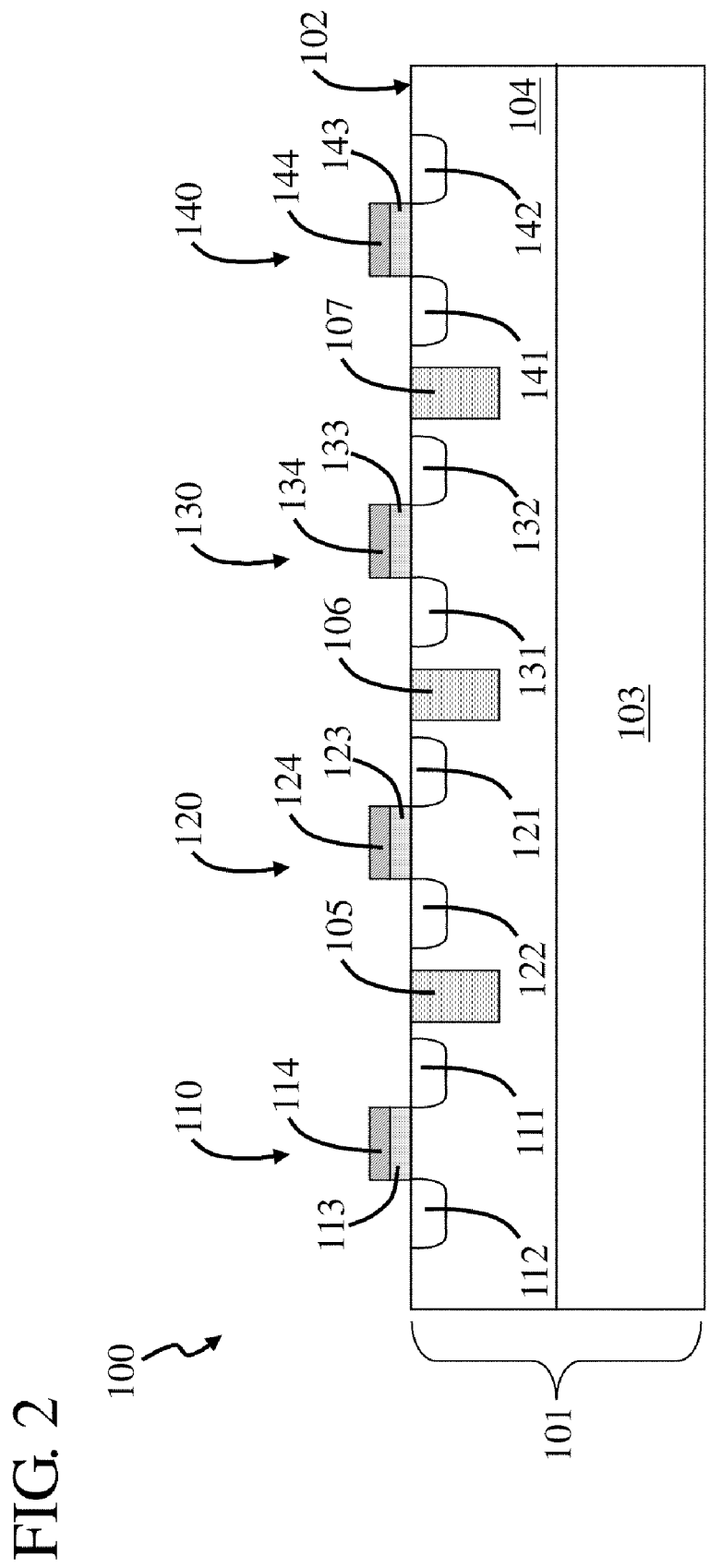
FIGS. 2, 3, 4, 5, 6, 7, 8, 9, 10a, 10b and 11 are sectional views of steps in forming the bonded semiconductor structure static random access memory circuit of FIG. 1.

In this embodiment, and as shown in FIG. 2, a support substrate 101 is provided, wherein support substrate 101 includes a substrate body region 103 and substrate well region 104. Support substrate 101 can include many different types of material. In this embodiment, support substrate 101 includes crystalline silicon. However, in some embodiments, support substrate 101 includes other semiconductor materials, such as silicon-germanium, gallium arsenide, gallium nitride and silicon carbide, etc. Support substrate 101 can have many different layer structures. In this embodiment, support substrate 101 is a single layer of semiconductor material. In other embodiments, support substrate can have a silicon-on-sapphire (SOS) layer structure, silicon-germanium layer structure, silicon-on-insulator (SOI) layer structure, etc.

In this embodiment, transistors 110, 120, 130 and 140 are carried by support substrate 101. The formation of transistors 110, 120, 130 and 140 often involves one or more processing steps, such as photolithography, lift-off, ion implantation, deposition, etc. As mentioned above, transistors 110, 120, 130 and 140 are NMOS transistors, so that substrate well region 104 is a p-type well. Substrate well region 104 can be formed in many different ways, such as by using ion implantation.

In this embodiment, pass transistor 110 includes a source 111 and drain 112, which extend through substrate well region 104. Further, pass transistor 110 includes a control dielectric 113 positioned on a surface 102 of support substrate 101, and a control terminal 114 positioned on control dielectric 113. In operation, control terminal 114 controls the conductivity of a region of substrate well region 104 which extends between source 111 and drain 112.

In this embodiment, pull down transistor 120 includes a source 121 and drain 122, which extend through substrate well region 104. Further, pull down transistor 120 includes a control dielectric 123 positioned on surface 102 of support substrate 101, and a control terminal 124 positioned on control dielectric 123. In operation, control terminal 124 controls the conductivity of a region of substrate well region 104, which extends between drain 121 and source 122.

In this embodiment, pull down transistor 130 includes a source 131 and drain 132, which extend through substrate well region 104. Further, pull down transistor 130 includes a control dielectric 133 positioned on surface 102 of support substrate 101, and a control terminal 134 positioned on control dielectric 133. In operation, control terminal 134 controls the conductivity of a region of substrate well region 104, which extends between source 131 and drain 132.

In this embodiment, pass transistor 140 includes a source 141 and drain 142, which extend through substrate well region 104. Further, pass transistor 140 includes a control dielectric 143 positioned on a surface 102 of support substrate 101, and a control terminal 144 positioned on control dielectric 143. In operation, control terminal 144 controls the conductivity of a region of substrate well region 104, which extends between source 141 and drain 142.

In this embodiment, transistors 110, 120, 130 and 140 are isolated from each other. Transistors 110, 120, 130 and 140 can be isolated from each other in many different ways. In this embodiment, an isolation region 105 extends through substrate well region 104 between transistors 110 and 120. An isolation region 106 extends through substrate well region 104 between transistors 120 and 130. Further, an isolation region 107 extends through substrate well region 104 between transistors 130 and 140. Isolation regions 105, 106 and 107 restrict the flow of current through substrate well region 104. In this way, transistors 110, 120, 130 and 140 are isolated from each other. Isolation regions 105, 106 and 107 can be formed in many different ways. In one embodiment, isolation regions 105, 106 and 107 are formed by forming corresponding trenches through substrate well region 104, and filling the trenches with a dielectric material using a high density plasma (HDM) oxide technique.

It should be noted that support substrate 101 and transistors 110, 120, 130 and 140 can be provided in many different ways. For example, in some embodiments, support substrate 101 and transistors 110, 120, 130 and 140 are formed by the end user and, in other embodiments, support substrate 101 and transistors 110, 120, 130 and 140 are provided to the end user already formed.

Figure 3:
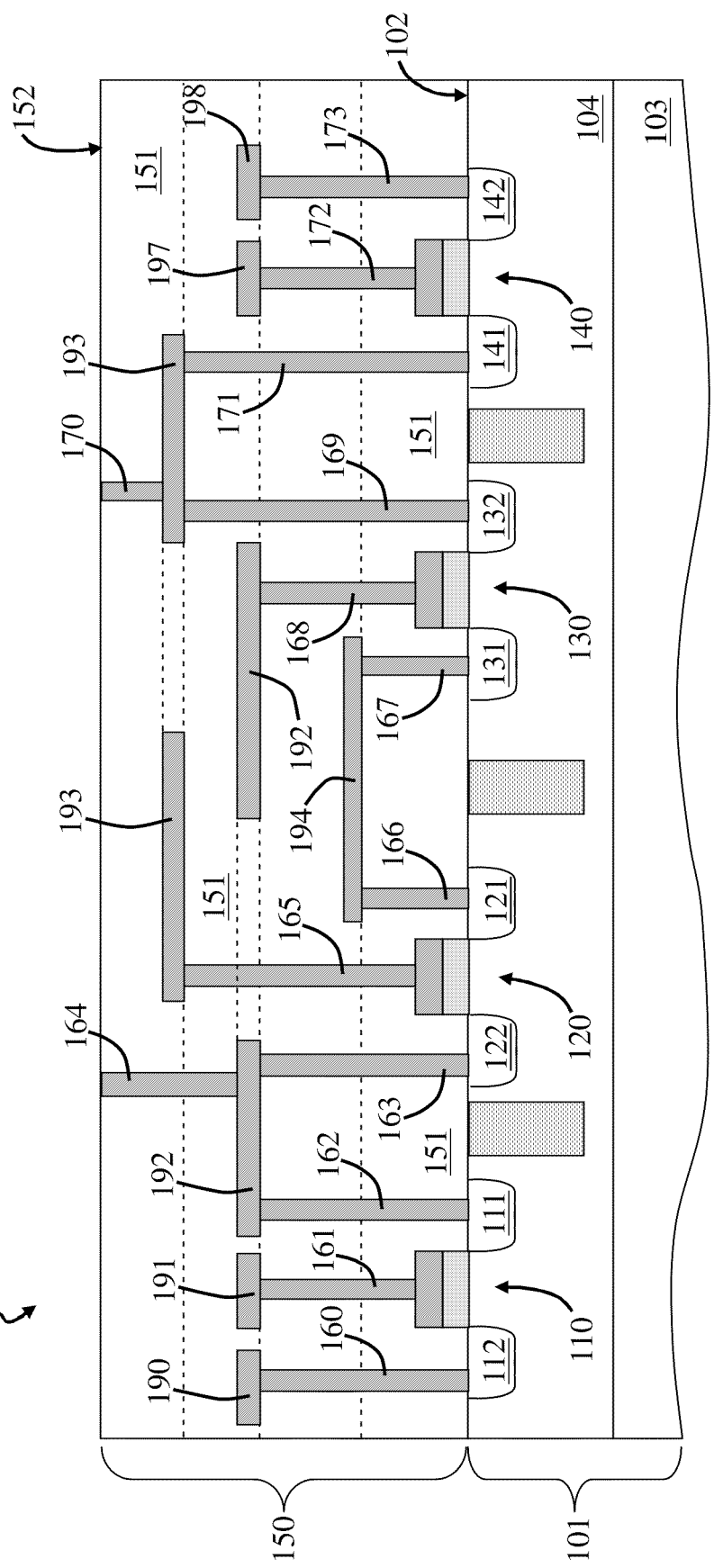

In FIG. 3, an interconnect region 150 is carried by support substrate 101. It should be noted that interconnect region 150 can be formed by the end user on support substrate 101, or it can be provided to the end user already formed on support substrate 101. In this embodiment, interconnect region 150 includes a dielectric material region 151 which is formed on surface 102. Dielectric material region 151 extends over and covers transistors 110, 120, 130 and 140. Dielectric material region 151 forms a growth interface proximate to surface 102, wherein the growth interface is a dielectric-to-semiconductor growth interface because it is established between dielectric material region 151 and substrate well region 104, which includes semiconductor material proximate to surface 102. Dielectric material region 151 can include many different types of dielectric materials, such as silicon dioxide, silicon nitride, PSG (PhosphoSilicate Glass), BPSG (BoroPhosphoSilicate Glass), USG (Undoped Silicate Glass) and PE-TEOS (Plasma Enhanced-TetraEthylOrthoSilicate Glass).

Interconnect region 150 includes one or more conductive lines, which extend through dielectric material region 151. The conductive lines can be of many different types, such as a via and interconnect, wherein a via extends perpendicular to surface 102 and an interconnect extends parallel to surface 102. The conductive lines are typically connected to transistors 110, 120, 130 and/or 140 to allow them to communicate with each other, as well as pull up transistors 115 and 116, which will be discussed in more detail below. The connections between the conductive lines and transistors 110, 120, 130 and 140 are illustrated schematically in FIG. 1.

In this embodiment, a via 160 is connected to drain 112 and extends upwardly therefrom. A via 161 is connected to control terminal 114 and extends upwardly therefrom. Further, a via 162 is connected to source 111 and extends upwardly therefrom.

In this embodiment, a via 163 is connected to drain 122 and extends upwardly therefrom. A via 165 is connected to control terminal 124 and extends upwardly therefrom. Further, a via 166 is connected to source 121 and extends upwardly therefrom.

In this embodiment, a via 167 is connected to source 131 and extends upwardly therefrom. A via 168 is connected to control terminal 134 and extends upwardly therefrom. Further, a via 169 is connected to drain 132 and extends upwardly therefrom.

In this embodiment, a via 171 is connected to source 141 and extends upwardly therefrom. A via 172 is connected to control terminal 144 and extends upwardly therefrom. Further, a via 173 is connected to source 142 and extends upwardly therefrom.

In this embodiment, interconnect region 150 includes interconnects 190 and 191 connected to vias 160 and 161, respectively. Interconnect region 150 includes an interconnect 192 which extends between vias 162 and 163 so that source 111 and drain 121 are connected together. Interconnect region 150 includes an interconnect 194 which extends between vias 166 and 167 so that source 122 and drain 131 are connected together. Interconnect region 150 includes interconnects 197 and 198 connected to vias 172 and 173, respectively. Interconnect region 150 includes a via 164 connected to interconnect 192, wherein via 164 extends upwardly therefrom. Interconnect region 150 includes a via 170 connected to interconnect 196, wherein via 170 extends upwardly therefrom.

The vias of bonded semiconductor structure SRAM circuit 100 can be formed in many different ways. The formation of the vias typically involves one or more etching steps to form an opening through a dielectric material region. The formation of the vias typically includes one or more depositions steps to deposit the material of the via through the opening formed through the dielectric material region. Many different types of etching, such as wet and dry etching, can be used to form the openings. The wet etching typically involves using anisotropic etching, so that the opening can be formed with a desired pitch.

The material of the conductive lines can be of many different types, such as aluminum and copper and refractory metal. It should be noted that the conductive lines are typically connected to a semiconductor material through a contact metal, which forms an ohmic contact. For example, the conductive lines are typically connected to a corresponding source or drain of a transistor through an ohmic contact. However, the contact metals are not shown herein for simplicity. The contact metals can be of many different types, such as tungsten (W), titanium (Ti), molybdenum (Mo), tantalum (Ta), titanium nitride (TiN), tantalum nitride (TaN), zirconium nitride (ZrN), tungsten nitride, and alloys thereof.

Figure 4:
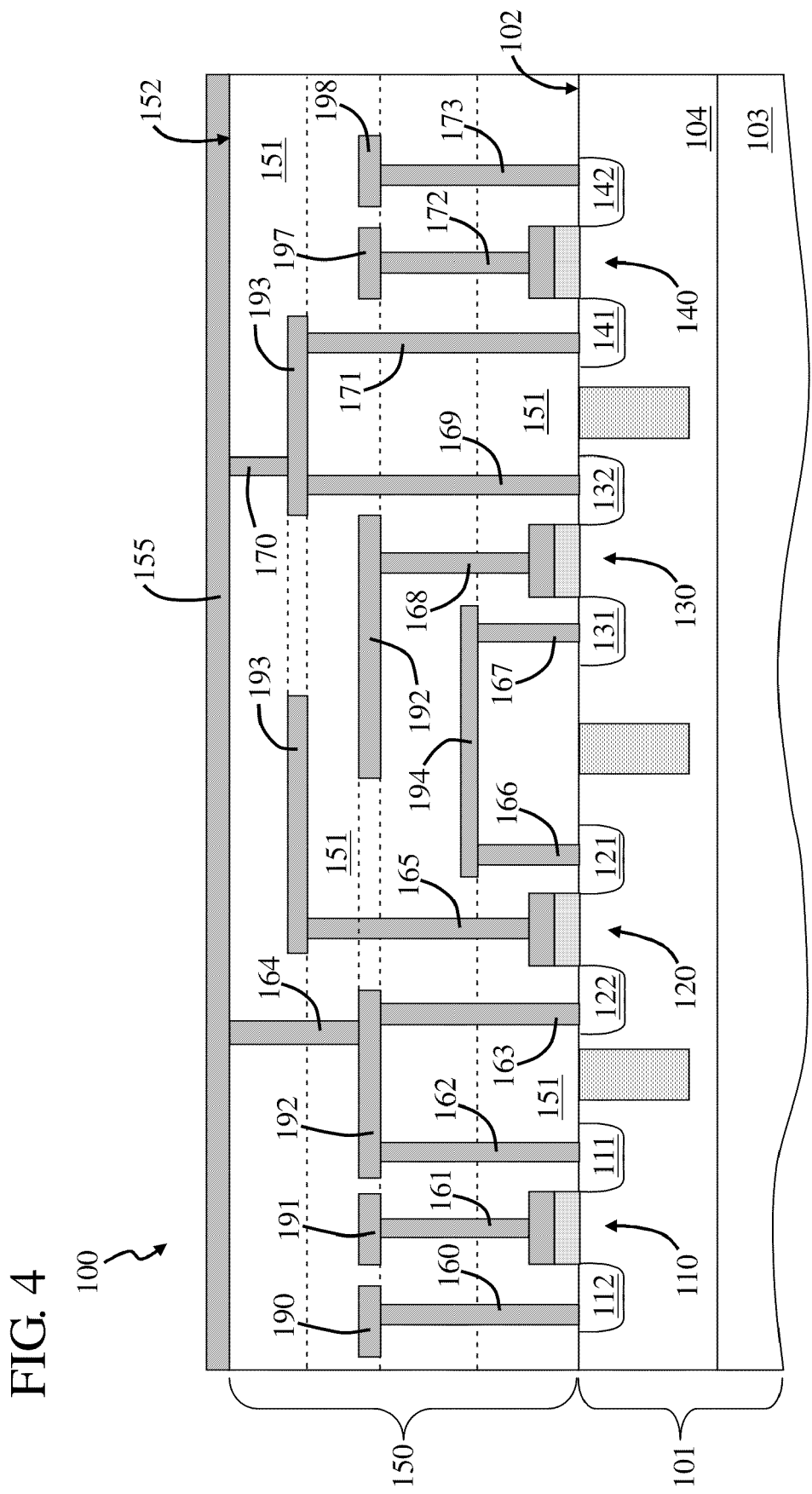

In FIG. 4, a conductive bonding layer 155 is formed on surface 152 of interconnect region 150, wherein conductive bonding layer 155 is connected to vias 164 and 170. Conductive bonding layer 155 forms a metal-to-dielectric growth interface with dielectric material region 151. Conductive bonding layer 155 can include many different types of conductive materials, such as titanium, titanium nitride and aluminum. In other embodiments, bonding layer 155 is replaced with a non-conductive bonding layer, such as a dielectric material or photo-setting adhesive. There are many different types of photo-setting adhesives that can be used as a non-conductive bonding layer, such as a reaction-setting adhesive, thermal-setting adhesive, UV-setting adhesive, or anaerobe adhesive.

Conductive bonding layer 155 includes a conductive material which has lower melting temperature than that of the conductive material of the conductive lines of interconnect region 150. It is useful to include conductive material in conductive bonding layer 155 that can be reflowed to increase its uniformity. Reflowing conductive bonding layer 155 allows it to form a bonding interface with another material, wherein the bonding interface is formed with a fewer number of voids and defects which can reduce the bond strength. In some embodiments, conductive bonding layer 155 can be planarized to increase its uniformity and to remove defects and impurities from its surface.

Figure 5:
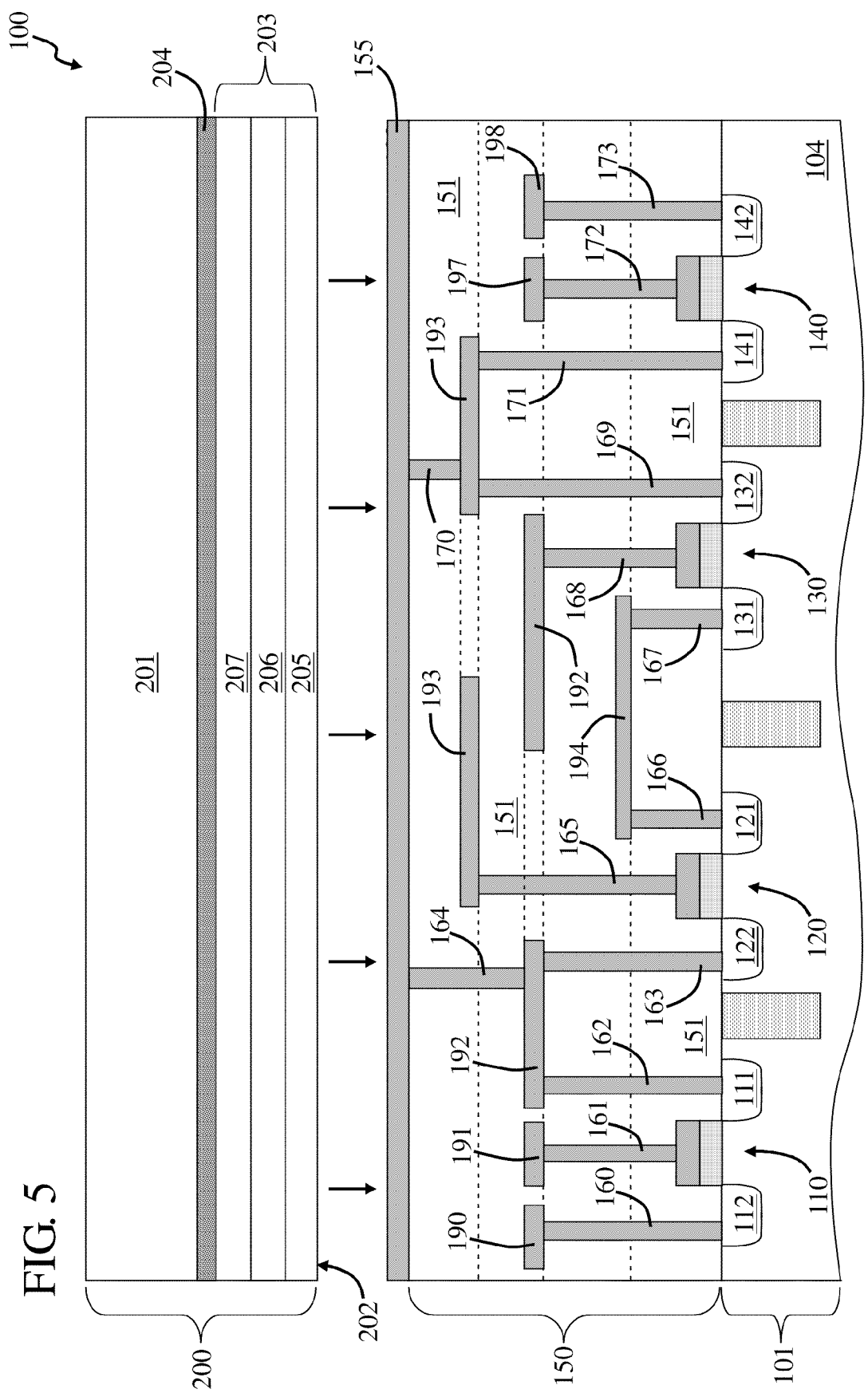

In FIG. 5, a donor substrate 200 is provided. In this embodiment, donor substrate 200 includes a donor substrate body region 201 and semiconductor layer stack 203, which are separated from each other by a detach region 204. In this embodiment, semiconductor layer stack 203 includes a semiconductor layer 207 positioned adjacent to detach region 204 and a semiconductor layer 206 positioned on layer 207. Further, semiconductor layer stack 203 includes a semiconductor layer 205 positioned on semiconductor layer 206. It should be noted that semiconductor layers 205, 206 and 207 are typically formed as blanket layers of semiconductor material.

Semiconductor layer stack 203 can be doped in many different ways. For example, in some embodiments, semiconductor layers 205, 206 and 207 are doped n-type, p-type and n-type, respectively, so that an np junction is established between semiconductor layers 205 and 206, and a pn junction is established between semiconductor layers 206 and 207. Semiconductor layers 205, 206 and 207 are doped n-type, p-type and n-type, respectively, when it is desirable to form an NMOS transistor with semiconductor layer stack 203.

In this embodiment, semiconductor layers 205, 206 and 207 are doped p-type, n-type and p-type, respectively, so that a pn junction is established between semiconductor layers 205 and 206, and an np junction is established between semiconductor layers 206 and 207. Semiconductor layers 205, 206 and 207 are doped p-type, n-type and p-type, respectively, when it is desirable to form a PMOS transistor with semiconductor layer stack 203.

Donor substrate 200 can include many different types of materials. The semiconductor material of donor substrate 200 typically includes crystalline semiconductor material. In this embodiment, donor substrate body region 201 and semiconductor layer stack 203 include crystalline semiconductor material. In particular, in this embodiment, donor substrate body region 201 and semiconductor layer stack 203 include crystalline silicon. In other embodiments, donor substrate body region 201 and semiconductor layer stack 203 include other types of semiconductor material, such as silicon-germanium, silicon carbide, gallium nitride and gallium arsenide. In some embodiments, donor substrate body region 201 includes a glass material.

In some embodiments, the semiconductor material of semiconductor layer stack 203 includes crystalline semiconductor material. In some embodiments, the semiconductor material of semiconductor layer stack 203 consists of crystalline semiconductor material. In some embodiments, the semiconductor material of semiconductor layer stack 203 consists essentially of crystalline semiconductor material.

In some embodiments, the semiconductor material of semiconductor layer stack 203 includes silicon. In some embodiments, the semiconductor material of semiconductor layer stack 203 consists of silicon. In some embodiments, the semiconductor material of semiconductor layer stack 203 consists essentially of silicon. In any of these embodiments, the gallium arsenide can include crystalline silicon.

In some embodiments, the semiconductor material of semiconductor layer stack 203 includes silicon-germanium. In some embodiments, the semiconductor material of semiconductor layer stack 203 consists of silicon-germanium. In some embodiments, the semiconductor material of semiconductor layer stack 203 consists essentially of silicon-germanium. In any of these embodiments, the gallium arsenide can include crystalline silicon-germanium.

In some embodiments, the semiconductor material of semiconductor layer stack 203 includes silicon carbide. In some embodiments, the semiconductor material of semiconductor layer stack 203 consists of silicon carbide. In some embodiments, the semiconductor material of semiconductor layer stack 203 consists essentially of silicon carbide. In any of these embodiments, the gallium arsenide can include crystalline silicon carbide.

In some embodiments, the semiconductor material of semiconductor layer stack 203 includes gallium nitride. In some embodiments, the semiconductor material of semiconductor layer stack 203 consists of gallium nitride. In some embodiments, the semiconductor material of semiconductor layer stack 203 consists essentially of gallium nitride. In any of these embodiments, the gallium arsenide can include crystalline gallium nitride.

In some embodiments, the semiconductor material of semiconductor layer stack 203 includes gallium arsenide. In some embodiments, the semiconductor material of semiconductor layer stack 203 consists of gallium arsenide. In some embodiments, the semiconductor material of semiconductor layer stack 203 consists essentially of gallium arsenide. In any of these embodiments, the gallium arsenide can include crystalline gallium arsenide.

It should be noted that semiconductor layer stack 203 typically includes silicon material when it is desired to form an SRAM memory circuit. However, semiconductor layer stack 203 can include other types of semiconductor materials, such as those mentioned above, if it is desired to form other types of circuits, such as high power and high frequency transistors, as well as optical devices, such as semiconductor lasers, light emitting diodes and photosensors.

It should also be noted that, in some embodiments, semiconductor layer stack 203 includes a single layer of semiconductor material with stacked differently doped semiconductor regions and, in other embodiments, semiconductor layer stack 203 includes a plurality of differently doped semiconductor layers. In embodiments wherein semiconductor layer stack 203 includes a single layer of semiconductor material with stacked differently doped semiconductor layers, the stacked differently doped semiconductor regions are formed using ion implantation. In embodiments wherein semiconductor layer stack 203 includes a plurality of differently doped semiconductor layers, the differently doped semiconductor layers are doped during growth, although they can be doped using ion implantation, if desired.

It should also be noted that semiconductor layer stack 203 can include doped regions that are uniformly doped and doped regions that are non-uniformly doped. More information regarding doped regions that are uniformly doped and non-uniformly doped can be found in U.S. Pat. No. 7,470,598, the contents of which are incorporated herein by reference as though fully set forth herein.

Detach region 204 can include many different types of material. In one embodiment, the material of detach region 204 has a lower mechanical strength than the material of donor substrate body region 201 and semiconductor layer stack 203. In another embodiment, the material of detach region 204 has a higher etch rate than the material of donor substrate body region 201 and semiconductor layer stack 203.

Examples of material that can be included with detach region 204 include porous silicon. Porous silicon can be formed in many different ways. One way of forming porous silicon is disclosed in U.S. Pat. No. 6,380,099. Porous silicon includes a number of pores extending therethrough, which reduces its mechanical strength compared to crystalline silicon. Further, porous silicon includes a number of pores extending therethrough, which increases its etch rate compared to crystalline silicon. Other examples of material that can be included with detach region 204 include an oxide material, nitride material, organic bonding material, or a strained layer formed by semiconductor layers having different lattice constants. One example of semiconductor layers having different lattice constants is silicon-germanium.

In some embodiments, detach layer 205 can include one or more implanted species, such as hydrogen, wherein the lattice structure of the material of detach layer 205 is damaged in response to receiving the implanted species. One technique for forming detach layer 205 with an implanted species is disclosed in U.S. Pat. No. 5,374,564.

It should be noted that the material of detach region 204, and its method of formation, typically depends on the material of semiconductor layer stack 203. For example, detach region 204 can include an alloy of gallium nitride when semiconductor layer stack 203 includes gallium nitride. In one particular example, donor substrate body region 201 includes sapphire or silicon carbide and detach region includes a material typically used as a buffer layer to form gallium nitride on sapphire and silicon carbide substrates. Buffer layers used to form gallium nitride on sapphire and silicon carbide substrates include III-V nitride semiconductor material, such as indium gallium nitride and aluminum gallium nitride.

It should be noted that, in the embodiments wherein semiconductor layer stack 203 includes gallium nitride, the method of manufacturing bonded semiconductor structure SRAM circuit 100 can include a step of using laser ablation to decouple donor substrate body region 201 from semiconductor layer stack 203. More information regarding laser ablation can be found in U.S. Pat. Nos. 6,413,839, 6,849,524 and 6,902,990.

Detach region 204 can include an alloy of gallium arsenide when semiconductor layer stack 203 includes gallium arsenide. Detach region 204 can include an alloy of a III-V compound semiconductor material when semiconductor layer stack 203 includes gallium arsenide.

Detach region 204 can include an alloy of silicon carbide when semiconductor layer stack 203 includes silicon carbide. In one particular example, detach region 204 includes a polytype of silicon carbide and semiconductor layer stack 203 includes a different polytype of silicon carbide.

As mentioned above, in some embodiments, the material of detach region 204 is easier to etch than the material of semiconductor layer stack 203. In some embodiments, the material of detach region 204 has a lower mechanical strength than the material of semiconductor layer stack 203.

Figure 6:
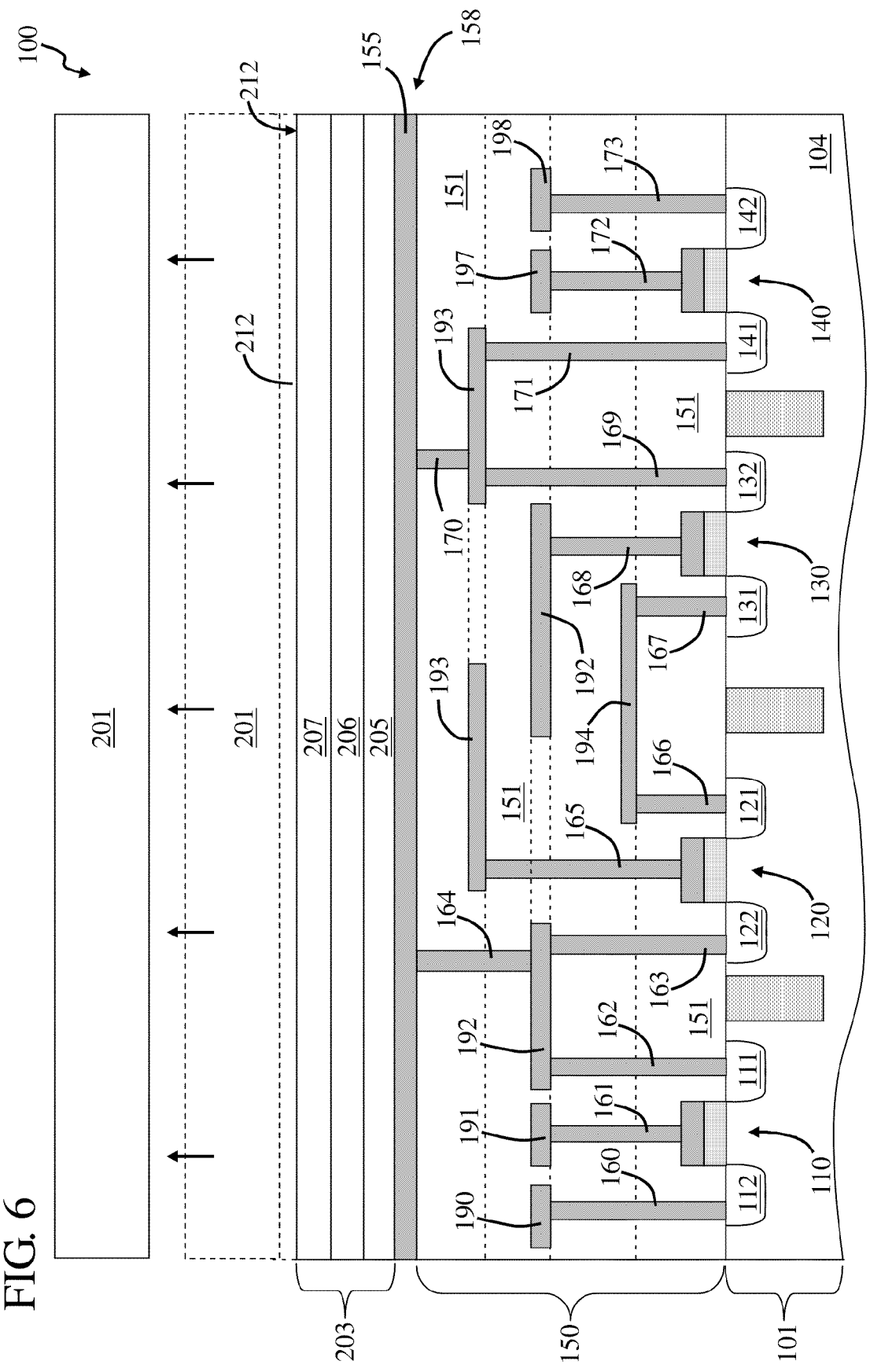

In FIG. 5, donor substrate 200 is aligned with support substrate 101 and moved towards interconnect region 150 so that semiconductor layer stack 203 is bonded to conductive bonding layer 155, and a bonding interface 158 is formed therebetween, as shown in FIG. 6. In particular, a surface 202 of semiconductor layer stack 203 is moved towards conductive bonding layer 155 so that bonding interface 158 is formed between semiconductor layer stack 203 and conductive bonding layer 155. Semiconductor layer 205 is moved towards conductive bonding layer 155 so that bonding interface 158 is formed between semiconductor layer 205 and conductive bonding layer 155. The bonding can be accomplished in many different ways, such as those disclosed in U.S. Pat. No. 7,470,142, the contents of which are incorporated herein by reference as though fully set forth herein.

It should be noted that bonding interface 158 is formed using wafer-to-wafer alignment, which does not require a precise alignment between donor substrate 200 and support substrate 101. Hence, the alignment between donor substrate 200 and support substrate 101 can be accomplished faster using less expensive equipment. Being able to align donor substrate 200 and support substrate 101 faster increases the throughput when manufacturing a number of bonded semiconductor structure SRAM circuits.

In FIG. 5, donor substrate 200 is coupled to support substrate 101 through bonding interface 158. Further, donor substrate 200 is coupled to interconnect region 150 through bonding interface 158. Semiconductor layer stack 203 is coupled to support substrate 101 through bonding interface 158. Further, semiconductor layer stack 203 is coupled to interconnect region 150 through bonding interface 158. Detach region 204 is coupled to support substrate 101 through bonding interface 158. Further, detach region 204 is coupled to interconnect region 150 through bonding interface 158.

A bonding interface is an interface that is formed in response to bonding material layers together. In one example of forming a bonding interface, first and second material layers are formed as separate layers, and moved towards each other so they engage each other and the bonding interface is formed in response. In this way, a bonding interface is established. It should be noted that heat is generally applied to the first and/or second material layers to facilitate the formation of the bonding interface. In a metal-to-metal bonding interface, the first and second material layers that are bonded together are conductive materials, such as metals. In a metal-to-dielectric bonding interface, one of the first and second material layers is a conductive material, and the other one is a dielectric material. In a metal-to-semiconductor bonding interface, one of the first and second material layers is a conductive material, and the other one is a semiconductor material.

A growth interface is an interface that is formed in response to growing a material layer on another material layer. In one example of forming a growth interface, a third material layer is formed, and a fourth material layer is grown on the third material layer so that the growth interface is formed in response. In this way, a growth interface is established. The fourth material layer can be grown on the third material layer in many different ways, such as by chemical vapor deposition and sputtering. Hence, when forming a growth interface, third and fourth material layers are not formed as separate layers, and moved to engage each other.

In a metal-to-metal growth interface, the third and fourth material layers are conductive materials, such as metals. In a metal-to-dielectric growth interface, one of the third and fourth material layers is a conductive material, and the other one is a dielectric material. In a metal-to-semiconductor growth interface, one of the third and fourth material layers is a conductive material, and the other one is a semiconductor material. In a dielectric-to-dielectric growth interface the third and fourth materials are dielectric materials.

It should be noted that, in general, it is difficult to establish a metal-to-semiconductor growth interface, wherein the semiconductor material is grown on the metal layer. Further, it is difficult to grow a crystalline semiconductor material layer on a metal layer using semiconductor growth techniques, such as chemical vapor deposition. In most instances, the metal layer is formed on the semiconductor material. It is difficult to grow semiconductor material on a metal layer because metal layers do not operate as a very good seed layer for the semiconductor material. Hence, a significant amount of the semiconductor material will not agglomerate on the metal layer.

It is difficult to grow crystalline semiconductor material on the metal layer because metal layers tend to not be crystalline, and semiconductor material tends to have the crystal structure of the material it is formed on. Hence, if a semiconductor material is formed on a metal layer that includes non-crystalline conductive material, then the semiconductor material will also have a non-crystalline crystal structure and poor material quality. Thus, it is useful to bond crystalline semiconductor material to a metal layer to form a metal-to-semiconductor bonding interface.

In general, bonding and growth interfaces have different types and amounts of defects. For example, dislocations often extend from a growth interface in the direction of material growth. The difference between bonding and growth interfaces can be determined in many different ways, such as by using Transmission Electron Microscopy (TEM) to determine the type and amount of defects proximate to the interface. Information regarding TEM can be found in U.S. Pat. Nos. 5,892,225, 6,531,697, 6,822,233 and 7,002,152.

More information regarding bonding and growth interfaces can be found in related U.S. patent application Ser. No. 11/606,523, the contents of which are incorporated herein by reference as though fully set forth herein. Information regarding bonding and growth interfaces can also be found in U.S. Pat. Nos. 5,152,857, 5,695,557, 5,980,633 and 6,534,382.

In FIG. 6, donor substrate body region 201 is decoupled from semiconductor layer stack 203 by separating donor substrate body region 201 from semiconductor layer stack 203. It should be noted that donor substrate body region 201 and detach region 204 are shown in phantom in FIG. 6 coupled to semiconductor layer stack 203. Donor substrate body region 201 can be separated from semiconductor layer stack 203 in many different ways. In one embodiment, donor substrate body region 201 is separated from semiconductor layer stack 203 by etching through detach region 204. Hence, donor substrate body region 201 is decoupled from support substrate 101 and interconnect region 150 in response to etching through detach region 204. Donor substrate body region 201 is decoupled from semiconductor layer stack 203 so that donor substrate body region 201 is not coupled to support substrate 101 and interconnect region 150 through bonding interface 158. Donor substrate body region 201 is decoupled from semiconductor layer stack 203 so that semiconductor layer stack 203 is carried by support substrate 101 and interconnect region 150. Donor substrate body region 201 is decoupled from semiconductor layer stack 203 so that semiconductor layer stack 203 is coupled to support substrate 101 and interconnect region 150 through bonding interface 158, and semiconductor layer stack 203 is not coupled to donor substrate body region 201 through detach region 204.

Detach region 204 can be etched in many different ways, such as by using chemical etching. It should be noted that donor substrate body region 201 can be decoupled from semiconductor layer stack 203 in many other ways, such as by forming a crack through detach region 204. The crack can be formed through detach region 204 in many different ways, such as by applying a mechanical force. Donor substrate body region 201 is decoupled from semiconductor layer stack 203 so that a surface 212 of semiconductor layer stack 203 is exposed, wherein surface 212 is opposed to surface 202 and bonding interface 158. In some situations, surface 212 is polished to remove detach region 204 therefrom. Surface 212 can also be polished to remove defects therefrom. Surface 212 can be polished to adjust the thickness of semiconductor layer stack 203. Surface 212 can be polished to adjust the thickness of semiconductor layer 207.

In another embodiment, donor substrate body region 201 is separated from semiconductor layer stack 203 by forming one or more cracks through detach region 204. Hence, donor substrate body region 201 is decoupled from support substrate 101 and interconnect region 150 in response to cracking through detach region 204. Detach region 204 can be cracked in many different ways, such as by applying a mechanical force thereto.

It should be noted that, in FIG. 6, bonded semiconductor structure SRAM circuit 100 includes horizontally oriented transistors carried by support substrate 101, wherein the horizontally oriented transistors are in communication with each other through conductive bonding layer 155. For example, in FIG. 6, transistors 110 and 120 are in communication with each other through via 162, interconnect 192, via 164, conductive bonding layer 155, via 170 interconnect 193 and via 165. In particular, source 111 is in communication with control terminal 124 through via 162, interconnect 192, via 164, conductive bonding layer 155, via 170 interconnect 193 and via 165. In this way, bonded semiconductor structure SRAM circuit 100 includes, in a step of the method of manufacturing, horizontally oriented transistors with source and control terminals in communication with each other through a conductive bonding layer.

In FIG. 6, transistors 110 and 140 are in communication with each other through via 162, interconnect 192, via 164, conductive bonding layer 155, via 170 interconnect 193 and via 171. In particular, source 111 is in communication with source 141 through via 162, interconnect 192, via 164, conductive bonding layer 155, via 170 interconnect 193 and via 171. In this way, bonded semiconductor structure SRAM circuit 100 includes, in a step of the method of manufacturing, horizontally oriented transistors with sources in communication with each other through a conductive bonding layer.

Further, in FIG. 6, transistors 120 and 130 are in communication with each other through via 163, interconnect 192, via 164, conductive bonding layer 155, via 170, interconnect 193 and via 169. In particular, drain 122 is in communication with drain 132 through via 163, interconnect 192, via 164, conductive bonding layer 155, via 170 interconnect 193 and via 169. In this way, bonded semiconductor structure SRAM circuit 100 includes, in a step of the method of manufacturing, horizontally oriented transistors with drains in communication with each other through a conductive bonding layer.

In FIG. 6, transistors 120 and 140 are in communication with each other through via 163, interconnect 192, via 164, conductive bonding layer 155, via 170, interconnect 193 and via 171. In particular, drain 122 is in communication with source 141 through via 163, interconnect 192, via 164, conductive bonding layer 155, via 170, interconnect 193 and via 171. In this way, bonded semiconductor structure SRAM circuit 100 includes, in a step of the method of manufacturing, horizontally oriented transistors with a source and drain in communication with each other through a conductive bonding layer.

In FIG. 6, drain 122 and control terminal 124 of transistor 120 are in communication with each other through via 163, interconnect 192, via 164, conductive bonding layer 155, via 170, interconnect 193 and via 165. In this way, bonded semiconductor structure SRAM circuit 100 includes, in a step of the method of manufacturing, a horizontally oriented transistor with a drain and control terminal in communication with each other through a conductive bonding layer.

Figure 7:
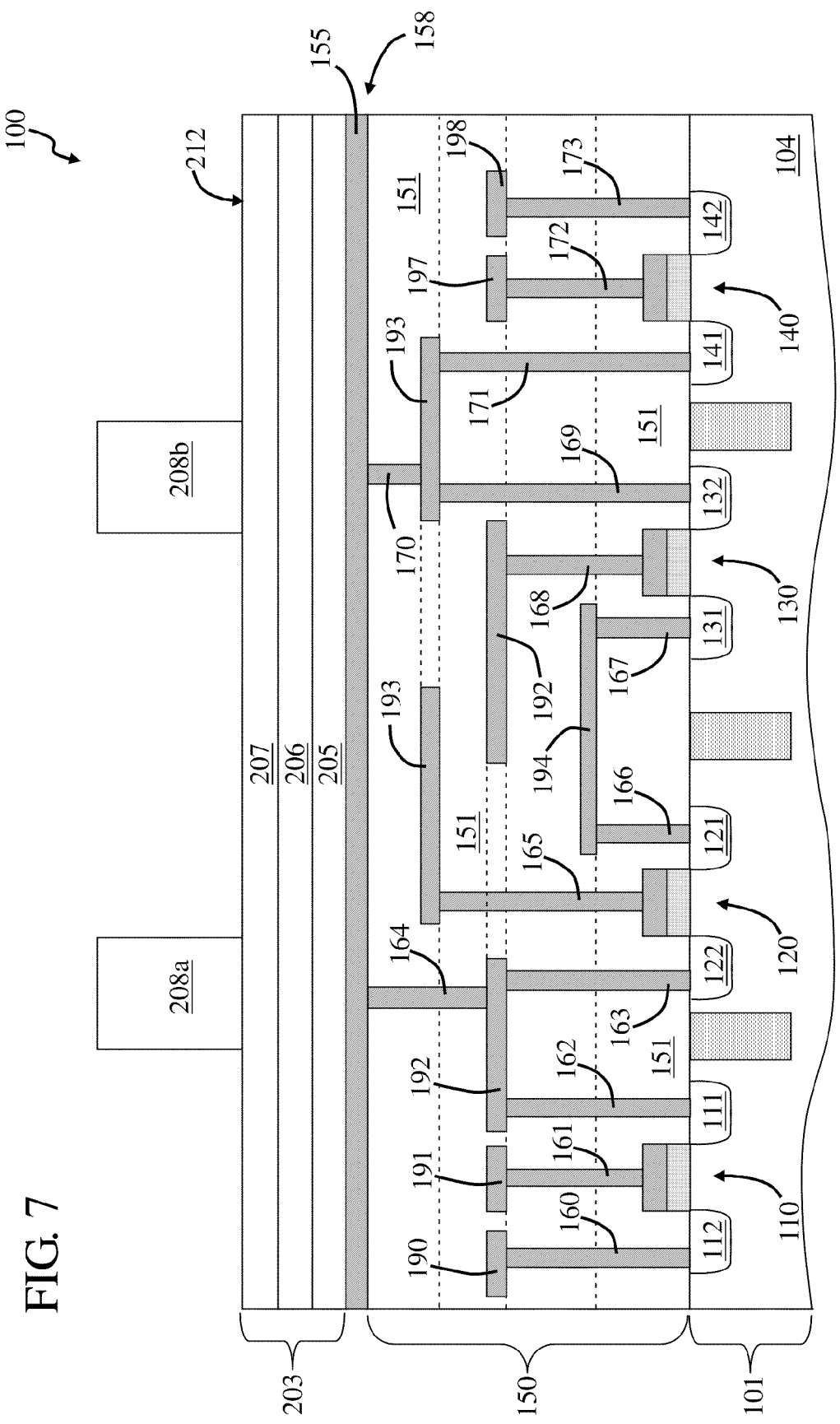

In FIG. 7, a mask is formed on surface 212, wherein the mask is patterned to allow a portion of semiconductor layer stack 203 to be removed. The mask can be of many different types, such as one that is used in photolithography. In this embodiment, the mask includes photoresist regions 208a and 208b, which are formed on surface 212 and spaced apart from each other. Photoresist regions 208a and 208b are positioned so they are above vias 164 and 170, respectively, for reasons which are discussed in more detail presently. Photoresist regions 208a and 208b include photoresist material that is more resistant to etching than the semiconductor material of semiconductor layer stack 203. Photoresist regions 208a and 208b include photoresist material that is more resistant to etching than the material of conductive bonding layer 155. Photoresist regions 208a and 208b can be formed in many different ways, such as by using standard photoresist deposition, patterning and photolithography techniques.

Figure 8:
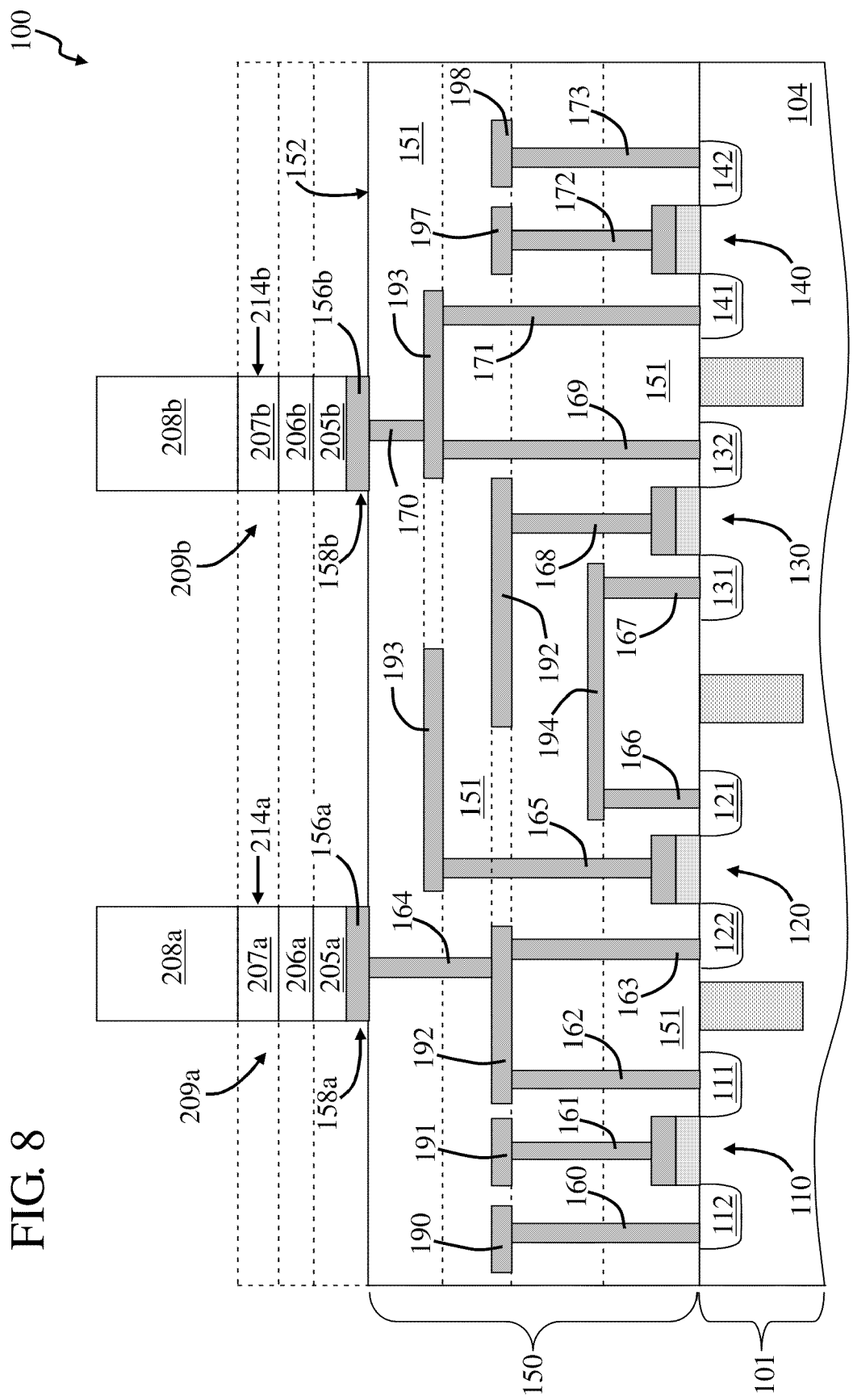

In FIG. 8, semiconductor layer stack 203 is etched to remove portions thereof away from photoresist regions 208a and 208b. In particular, portions of semiconductor layer stack 203 are etched to form mesa structures 209a and 209b, wherein mesa structure 209a extends between mask region 208a and via 164 and mesa structure 209b extends between mask region 208b and via 170. Mesa structures 209a and 209b can have many different shapes, such as rectangular and cylindrical. Mesa structures 209a and 209b include sidewalls 214a and 214b, respectively, which extend away from surface 152. Sidewalls 214a and 214b extend away from conductive bonding contact regions 156a and 156b, respectively. In this embodiment, sidewall 214a is an annular sidewall because it extends annularly around semiconductor layers 205a, 206a and 207a. Further, sidewall 214b is an annular sidewall because it extends annularly around semiconductor layers 205b, 206b and 207b. It should be noted that sidewall 214a extends around the outer periphery of semiconductor layers 205a, 206a and 207a, and sidewall 214b extends around the outer periphery of semiconductor layers 205b, 206b and 207b.

Mesa structure 209a includes semiconductor layers 205a, 206a and 207a, wherein semiconductor layers 205a, 206a and 207a correspond to portions of semiconductor layer stack 203 between photoresist region 208a and via 164 that have not been etched away. In particular, semiconductor layers 205a, 206a and 207a correspond to portions of semiconductor layers 205, 206 and 207, respectively, between photoresist region 208a and via 164 that have not been etched away. More information regarding forming mesa structures can be found in U.S. patent application Ser. Nos. 11/092,500, 11/092,501 and 11/180,286, as well as U.S. Pat. Nos. 7,470,598 and 7,470,142, all of which are incorporated herein by reference as though fully set forth herein.

Semiconductor layer 206a is positioned between semiconductor layers 205a and 207a, and semiconductor layer 205a is positioned towards via 164 and semiconductor layer 207a is positioned away from via 164. Semiconductor layers 207a and 205a operate as a source and drain, respectively, of pull up transistor 115. Semiconductor layer 206a operates as a channel region with a conductivity that can be controlled in response to a control signal applied to a control terminal 211a.

Mesa structure 209b includes semiconductor layers 205b, 206b and 207b, wherein semiconductor layers 205b, 206b and 207b correspond to portions of semiconductor layer stack 203 between photoresist region 208b and via 170 that have not been etched away. In particular, semiconductor layers 205b, 206b and 207b correspond to portions of semiconductor layers 205, 206 and 207, respectively, between photoresist region 208b and via 170 that have not been etched away.

Semiconductor layer 206b is positioned between semiconductor layers 205b and 207b, and semiconductor layer 205b is positioned towards via 170 and semiconductor layer 207b is positioned away from via 170. Semiconductor layers 207b and 205b operate as a source and drain, respectively, of pull up transistor 116. Semiconductor layer 206b operates as a channel region with a conductivity that can be controlled in response to a control signal applied to control terminal 211b.

Further, conductive bonding layer 155 is etched to remove portions thereof away from mesa structures 209a and 209b. In particular, portions of conductive bonding layer 155 are etched to leave conductive bonding contact regions 156a and 156b, wherein conductive bonding contact region 156a extends between mesa structure 209a and via 164 and conductive bonding contact region 156b extends between mesa structure 209b and via 170. Portions of conductive bonding layer 155 are etched to leave conductive bonding contact regions 156a and 156b, wherein regions 156a and 156b each include a sidewall which extends away from surface 152. Conductive bonding contact regions 156a and 156b carry mesa structures 209a and 209b, respectively. Conductive bonding contact regions 156a and 156b bond mesa structures 209a and 209b, respectively, to interconnect region 150. Mesa structures 209a and 209b are spaced from surface 152 by conductive bonding contact regions 156a and 156b, respectively.

Semiconductor layer stack 203 and conductive bonding layer 155 are etched to remove portions of bonding interface 158. In particular, portions of semiconductor layer stack 203 and conductive bonding layer 155 are etched to leave bonding interfaces 158a and 158b, wherein bonding interface 158a extends between mesa structure 209a and via 164 and bonding interface 158b extends between mesa structure 209b and via 170. Mesa structure 209a is coupled to support substrate 101 and interconnect region 150 through bonding interface 158a and mesa structure 209b is coupled to support substrate 101 and interconnect region 150 through bonding interface 158b. In particular, mesa structure 209a is coupled to via 164 through bonding interface 158a and mesa structure 209b is coupled to via 170 through bonding interface 158b. It should be noted that a signal that flows between mesa structure 209a and via 164 flows though bonding interface 158a and a signal that flows between mesa structure 209b and via 170 flows though bonding interface 158b. It should also be noted that the portions of semiconductor layer stack 203, conductive bonding region 155 and bonding interface 158 that are removed in FIG. 8 are shown in phantom.

Figure 9:
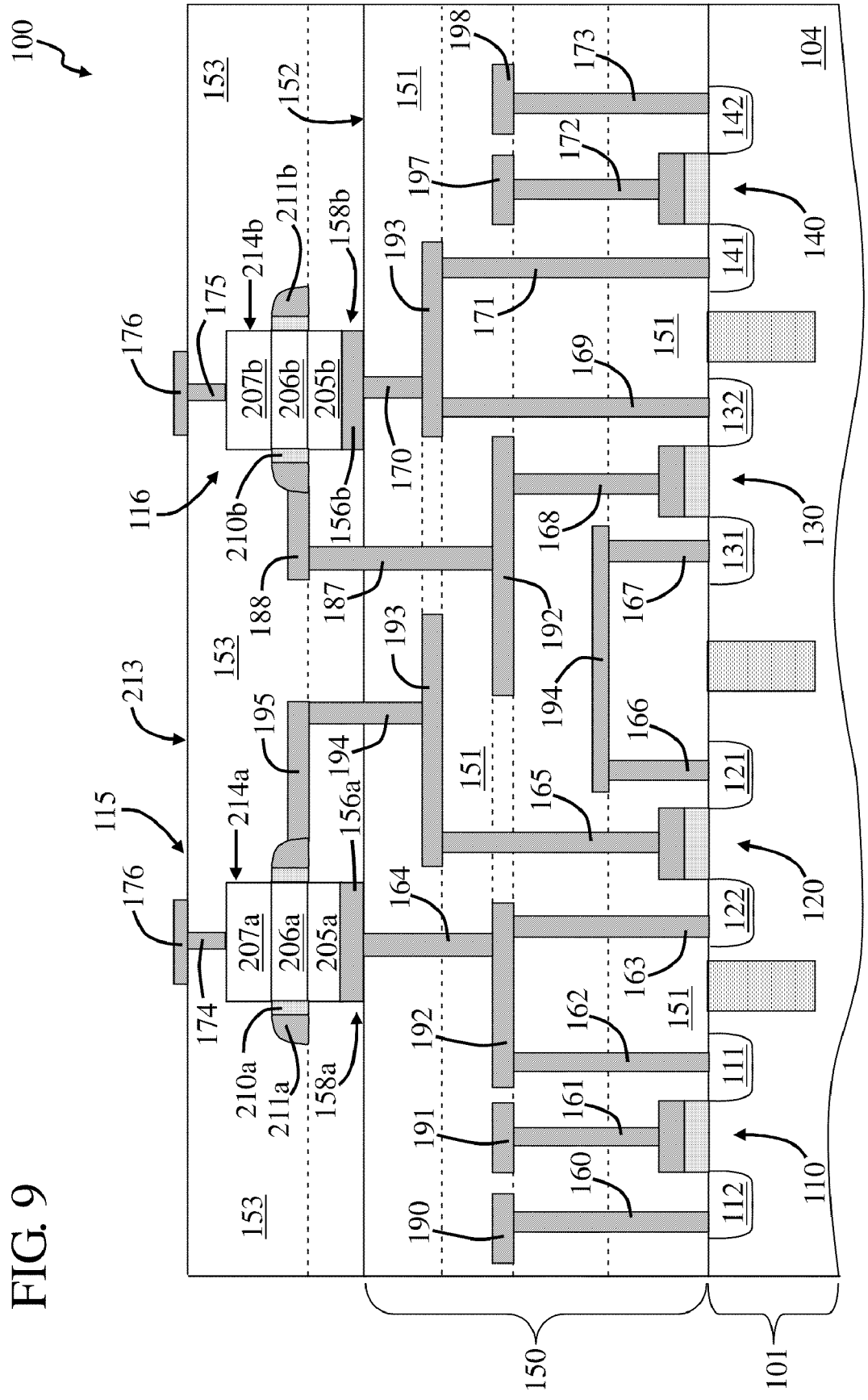
Figure 10A:
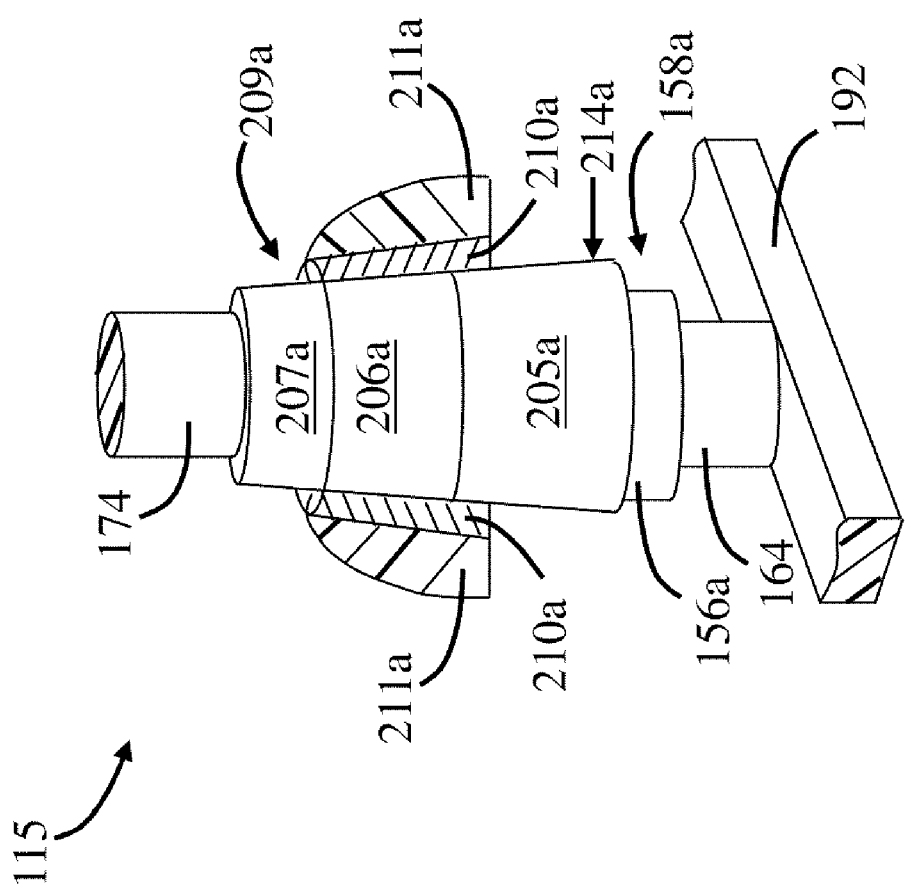
Figure 10B:
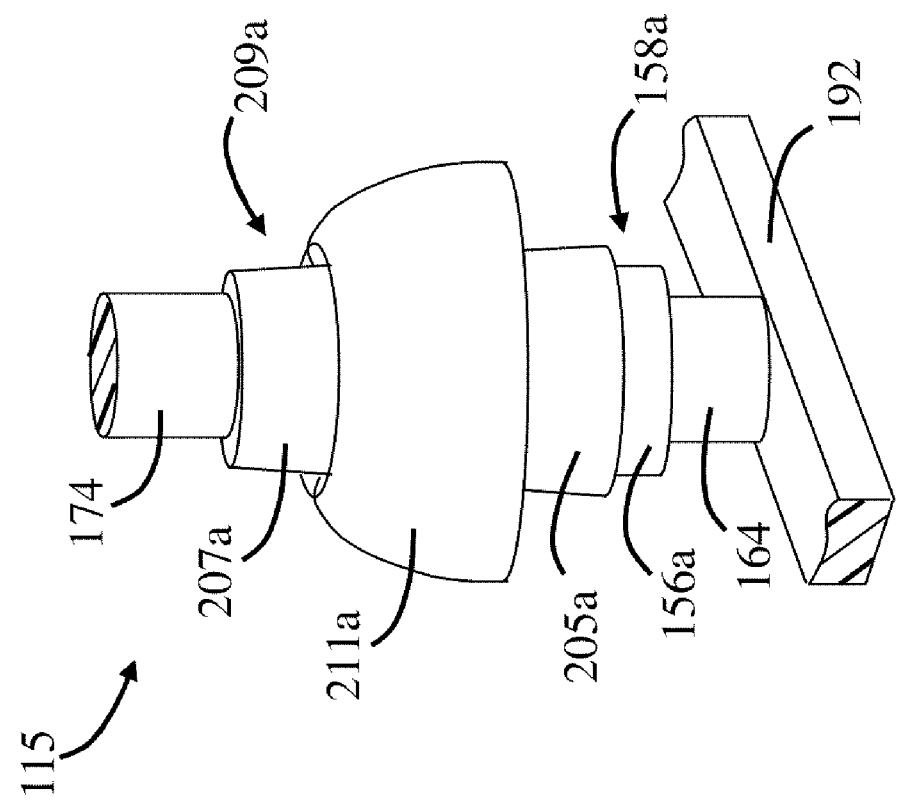

In FIG. 9, photoresist regions 208a and 208b have been removed and mesa structures 209a and 209b have been processed to form pull up transistors 115 and 116, respectively. Pull up transistor 115 is shown in a perspective view in FIGS. 10a and 10b. Mesa structures 208a and 208b can be processed to form pull up transistors 115 and 116, respectively, in many different ways. In this embodiment, a portion of a dielectric material region 153 is formed on interconnect region 150. A control dielectric 210a is formed around mesa structure 209a and a control terminal 211a is formed around control dielectric 210a. Control dielectric 210a and control terminal 211a are positioned around mesa structure 209a so that the conductivity of semiconductor layer 206a can be controlled in response to a control signal applied to control terminal 211a. Control dielectric 210a is positioned adjacent to sidewall 214a. Control dielectric 210a extends between sidewall 214a and control terminal 211a.

Further, a control dielectric 210b is formed around mesa structure 209b and a control terminal 211b is formed around control dielectric 210b. Control dielectric 210b and control terminal 211b are positioned around mesa structure 209b so that the conductivity of semiconductor layer 206b can be controlled in response to a control signal applied to control terminal 211b. Control dielectric 210b is positioned adjacent to sidewall 214b. Control dielectric 210b extends between sidewall 214b and control terminal 211b.

It is useful for transistors 115 and 116 to include mesa structures so that more current can flow therethrough. For example, vertically oriented transistors have been fabricated that allow more than about three to four times more current to flow therethrough than corresponding horizontally oriented devices. Another advantage is that the current flowing through the mesa structure is more spread out so that the vertically oriented transistor heats up less in response.

It should be noted that control dielectric 210a extends annularly around mesa structure 209a and control terminal 211a extends annularly around control dielectric 210a and mesa structure 209a. Further, control dielectric 210b extends annularly around mesa structure 209b and control terminal 211b extends annularly around control dielectric 210b and mesa structure 209b. It is useful for transistors 115 and 116 to include control dielectrics and control terminals which extend annularly around a mesa structure so that the current flowing through the mesa structure can be better controlled.

In this embodiment, a via 194 is formed so it extends through dielectric material regions 151 and 153 and connects to interconnect 193, and an interconnect 195 is formed so it extends between via 194 and control terminal 211a. In this way, control terminal 211a is connected to control terminal 124 of pull down transistor 120, as well as to drain 132 of pull down transistor 130 and source 141 of pass transistor 140.

Further, a via 187 is formed so it extends through dielectric material regions 151 and 153 and connects to interconnect 192, and an interconnect 188 is formed so it extends between via 187 and control terminal 211b. In this way, control terminal 211b is connected to control terminal 134 of pull down transistor 130, as well as to drain 132 of pull down transistor 130 and source 111 of pass transistor 110.

In this embodiment, another portion of dielectric material region 153 is formed on mesa structures 209a and 209b, as well as on interconnects 195 and 188. A via 174 is formed so it extends through dielectric material region 153 and connects to semiconductor layer 207a and a via 175 is formed so it extends through dielectric material region 153 and connects to semiconductor layer 207b. An interconnect 176 is formed on a surface 213 of dielectric material region 153, wherein interconnect 176 is connected to semiconductor layer 207a through via 174. Further, interconnect 176 is connected to semiconductor layer 207b through via 175. As mentioned above, power signal $V_{DD}$ is provided to interconnect 176.

Control terminals 211a and 211b can include many different types of conductive materials. In some embodiments, control terminals 211a and 211b include the same conductive materials as that included with the conductive lines of interconnect region 150. In other embodiments, control terminals 211a and 211b include different conductive materials than that included with the conductive lines of interconnect region 150.

Control dielectrics 210a and 210b can include many different dielectric materials. In some embodiments, control dielectrics 210a and 210b include the same dielectric materials as that included with the dielectric material region 153. In other embodiments, control dielectrics 210a and 210b include different dielectric materials than that included with dielectric material region 153. In some embodiments, control dielectrics 210a and/or 210b include a single layer of dielectric material and, in other embodiments, control dielectrics 210a and/or 210b include a plurality of dielectric material layers. For example, in one embodiment, control dielectrics 210a and/or 210b include an oxide-nitride-oxide layer structure. One example of an oxide-nitride-oxide layer structure is a layer structure with silicon nitride positioned between opposed silicon oxide layers.

Figure 11:
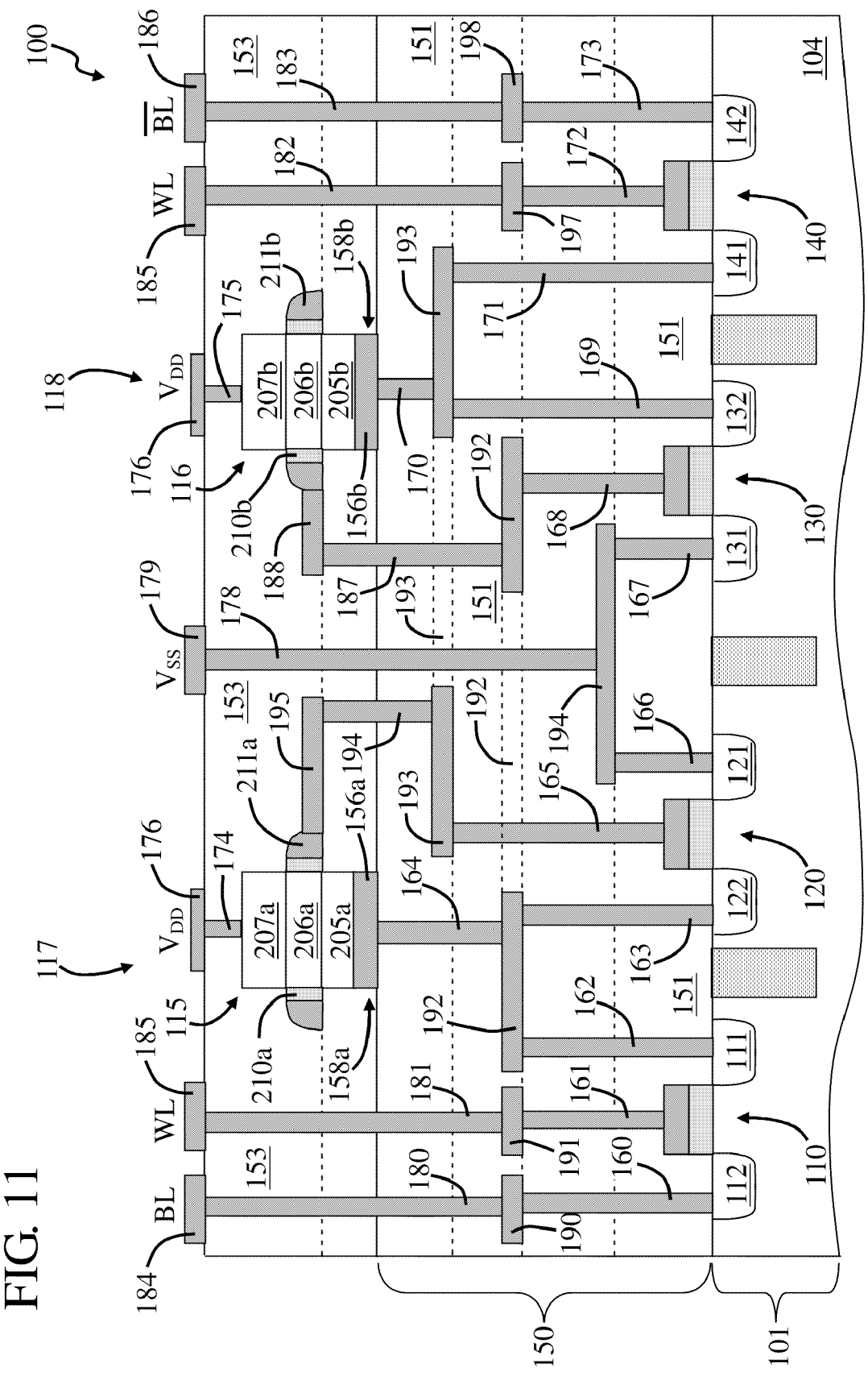

FIG. 11 is a side view of bonded semiconductor structure SRAM circuit 100, which includes transistors 110, 115, 116, 120, 130 and 140 connected together as shown in FIG. 1. In FIG. 11, a via 180 is formed so it extends through dielectric material regions 151 and 153, wherein via 180 is connected to drain 112 of pass transistor 110 through interconnect 190 and via 160. An interconnect 184 is formed on surface 213 of dielectric material region 153, wherein interconnect 184 is connected to drain 112 through vias 160 and 180, as well as through interconnect 190. As mentioned above, the bit line signal is provided to interconnect 184.

In FIG. 11, a via 181 is formed so it extends through dielectric material regions 151 and 153, wherein via 181 is connected to control terminal 114 of pass transistor 110 through interconnect 191 and via 161. An interconnect 185 is formed on surface 213 of dielectric material region 153, wherein interconnect 185 is connected to control terminal 114 through vias 161 and 181, as well as through interconnect 191. As mentioned above, the word line signal is provided to interconnect 185.

In FIG. 11, a via 183 is formed so it extends through dielectric material regions 151 and 153, wherein via 183 is connected to drain 142 of pass transistor 140 through interconnect 198 and via 173. An interconnect 186 is formed on surface 213 of dielectric material region 153, wherein interconnect 186 is connected to drain 142 through vias 173 and 183, as well as through interconnect 198. As mentioned above, the complement of the bit line signal is provided to interconnect 186.

In FIG. 11, a via 182 is formed so it extends through dielectric material regions 151 and 153, wherein via 182 is connected to control terminal 144 of pass transistor 140 through interconnect 197 and via 172. Interconnect 185 is connected to control terminal 144 through vias 172 and 182, as well as through interconnect 197.

In FIG. 11, a via 178 is formed so it extends through dielectric material regions 151 and 153, wherein via 178 is connected to interconnect 194. An interconnect 179 is formed on surface 213 of dielectric material region 153, wherein interconnect 179 is connected to source 122 of pull down transistor 120 through vias 166 and 178, as well as through interconnect 194. Interconnect 179 is also connected to source 132 of pull down transistor 130 through vias 167 and 178, as well as through interconnect 194. As mentioned above, the power signal $V_{SS}$ is provided to interconnect 179.

It should be noted that pull-up transistor 115 and pull down transistor 120 are connected together so they operate as inverter circuit 117. As mentioned above, pull up transistor 115 is a PMOS transistor and pull down transistor 120 is a pull down transistor so that inverter circuit 117 is a CMOS circuit. Pull-up transistor 115 and pull down transistor 120 are connected together through bonding interface 158a so that inverter circuit 117 is a bonded inverter circuit.

Further, pull-up transistor 116 and pull down transistor 130 are connected together through bonding interface 158b so they operate as inverter circuit 118. As mentioned above, pull up transistor 116 is a PMOS transistor and pull down transistor 130 is a pull down transistor so that inverter circuit 118 is a CMOS circuit. Pull-up transistor 116 and pull down transistor 130 are connected together through bonding interface 158b so that inverter circuit 118 is a bonded inverter circuit.

Semiconductor layer 105a is in communication with interconnect region 150 through bonding interface 158a. Control terminal 211a is not in communication with interconnect region 150 through a bonding interface. Instead, control terminal 211a is not in communication with interconnect region 150 through the growth interface between dielectric material regions 151 and 153.

It should be noted that, in the embodiment of FIG. 11, bonded semiconductor structure SRAM circuit 100 includes a single substrate well region per SRAM unit cell. In the embodiment of FIG. 11, the single substrate well region per SRAM unit cell is a p-type well because, as mentioned above, transistors 110, 120, 130 and 140 are NMOS transistors. Bonded semiconductor structure SRAM circuit 100 does not require an n-type well for pull up transistors 115 and 116 because, as mentioned above, pull up transistors 115 and 116 are bonded transistors which are capable of operating without an n-type well region. Hence, in some embodiments of FIG. 11, bonded semiconductor structure SRAM circuit 100 includes a single substrate well region per SRAM unit cell. In some embodiments of FIG. 11, the substrate well region of bonded semiconductor structure SRAM circuit 100 consists of a single substrate well region per SRAM unit cell. In some embodiments of FIG. 11, the substrate well region of bonded semiconductor structure SRAM circuit 100 consists essentially of a single substrate well region per SRAM unit cell. In some embodiments of FIG. 11, the substrate well region of bonded semiconductor structure SRAM circuit 100 consists of a single substrate n-type well region per SRAM unit cell. In some embodiments of FIG. 11, the substrate well region of bonded semiconductor structure SRAM circuit 100 consists essentially of a single substrate n-type well region per SRAM unit cell.

In other embodiments of FIG. 11, transistors 110, 120, 130 and 140 are PMOS transistors so that bonded semiconductor structure SRAM circuit 100 includes a single substrate well region per SRAM unit cell, which is an n-type well. In this embodiment, pull up transistors 115 and 116 are PMOS transistors. However, bonded semiconductor structure SRAM circuit 100 does not require a p-type well for pull up transistors 115 and 116 because, as mentioned above, pull up transistors 115 and 116 are bonded transistors which are capable of operating without a well region.

Hence, in this other embodiment of FIG. 11, bonded semiconductor structure SRAM circuit 100 includes a single substrate well region per SRAM unit cell. In some of these embodiments, the substrate well region of bonded semiconductor structure SRAM circuit 100 consists of a single substrate well region per SRAM unit cell. In some embodiments, the substrate well region of bonded semiconductor structure SRAM circuit 100 consists essentially of a single substrate well region per SRAM unit cell. In some embodiments, the substrate well region of bonded semiconductor structure SRAM circuit 100 consists of a single substrate p-type well region per SRAM unit cell. In some embodiments, the substrate well region of bonded semiconductor structure SRAM circuit 100 consists essentially of a single substrate p-type well region per SRAM unit cell.

Bonded semiconductor structure SRAM circuit 100 is different from other SRAM circuits in many different ways. For example, SRAM circuit 100 includes portions that are on opposed sides of a bonding interface. For example, pull up transistor 115 is on one side of bonding interface 158a and pull down transistor 120 is on an opposed side of bonding interface 158a. Further, pull up transistor 116 is on one side of bonding interface 158b and pull down transistor 130 is on an opposed side of bonding interface 158b. It is useful to have portions of SRAM circuit 100 on opposed sides of a bonding interface so that SRAM circuit 100 occupies less area.

SRAM circuit 100 includes different types of transistors that are on opposed sides of a bonding interface. For example, pull up transistor 115 is on one side of bonding interface 158a and pull down transistor 120 is on an opposed side of bonding interface 158a, wherein transistors 115 and 120 are PMOS and NMOS transistors, respectively. Further, pull up transistor 116 is on one side of bonding interface 158a and pull down transistor 130 is on an opposed side of bonding interface 158b, wherein transistors 116 and 130 are PMOS and NMOS transistors, respectively. It is useful to have different types of transistors on opposed sides of a bonding interface so that SRAM circuit 100 does not require both p-type well regions and n-type well regions. SRAM circuit 100 occupies less area because it does not require both p-type well regions and n-type well regions.

Another difference between SRAM circuit 100 and other SRAM circuits is that it includes transistors that are in communication with each other through a bonding interface. For example, pull up transistor 115 and pull down transistor 120 are in communication with each other through bonding interface 158a. Further, pull up transistor 116 and pull down transistor 130 are in communication with each other through bonding interface 158b. It is useful to have transistors in communication with each other through a bonding interface because, as mentioned above, a bonding interface has fewer defects than a growth interface. Hence, signals flowing between transistors in communication with each other through a bonding interface will be attenuated less so there will be fewer errors.

Another difference between SRAM circuit 100 and other SRAM circuits is that it includes an inverter circuit having a bonding interface. As mentioned above, SRAM circuit 100 includes inverter circuits 117 and 118, wherein inverter circuit 117 includes pull up transistor 115 and pull down transistor 120 and inverter circuit 118 includes pull up transistor 116 and pull down transistor 130. Inverter circuit 117 includes bonding interface 158a because pull up transistor 115 and pull down transistor 120 are in communication with each other through bonding interface 158a. Further, inverter circuit 118 includes bonding interface 158b because pull up transistor 116 and pull down transistor 130 are in communication with each other through bonding interface 158b. In this way, SRAM circuit 100 includes an inverter circuit having a bonding interface. It is useful to have transistors in communication with each other through a have an inverter circuit having a bonding interface because the inverter circuit occupies less area.

Figure 12A:
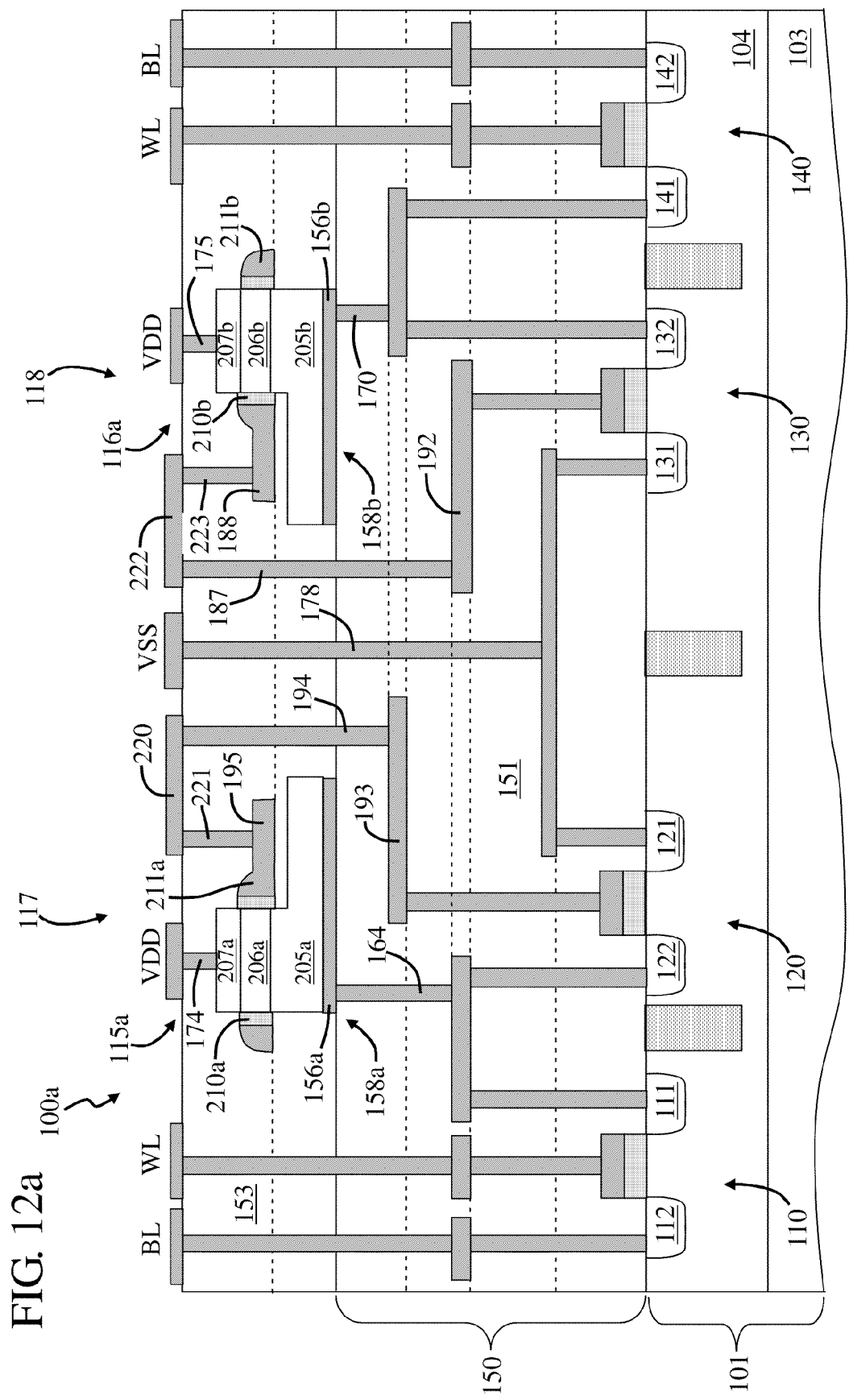

FIG. 12a shows another embodiment of a bonded semiconductor structure static random access memory (SRAM) circuit, which is denoted as bonded semiconductor structure static random access memory (SRAM) circuit 100a. In this embodiment, bonded semiconductor structure SRAM circuit 100a includes support substrate 101 and interconnect region 150, which are described in more detail above.

In this embodiment, bonded semiconductor structure SRAM circuit 100a includes a pull up transistor 115a, which is similar to pull up transistor 115. In this embodiment, however, semiconductor layer 205a is wider than semiconductor layer 206a. Further, semiconductor layer 205a is wider than semiconductor layer 207a. Semiconductor layer 205a is wider than semiconductor layers 206a and 207a so that the area of bonding interface 158a is increased. The area of bonding interface 158a is increased so that the bonding strength is increased. The bond strength of a bonding interface increases and decreases as the area of a bonding interface increases and decreases, respectively.

In this embodiment, control terminal 211a is connected to interconnect 195 and interconnect 195 is connected to an interconnect 220. Interconnect 220 is connected to interconnect 193 through via 194. It should be noted that via 194 extends between regions above and below bonding interface 158a.

In this embodiment, bonded semiconductor structure SRAM circuit 100a includes a pull up transistor 116a, which is similar to pull up transistor 116. In this embodiment, however, semiconductor layer 205b is wider than semiconductor layer 206b. Further, semiconductor layer 205b is wider than semiconductor layer 207b. Semiconductor layer 205b is wider than semiconductor layers 206b and 207b so that the area of bonding interface 158b is increased. The area of bonding interface 158b is increased so that the bonding strength is increased, as mentioned above.

In this embodiment, control terminal 211b is connected to interconnect 188 and interconnect 188 is connected to an interconnect 222. Interconnect 222 is connected to interconnect 192 through via 187. It should be noted that via 187 extends between regions above and below bonding interface 158a.

FIG. 12b shows another embodiment of a bonded semiconductor structure static random access memory (SRAM) circuit, which is denoted as bonded semiconductor structure static random access memory (SRAM) circuit 10b. In this embodiment, bonded semiconductor structure SRAM circuit 100b includes support substrate 101 and interconnect region 150, which are described in more detail above. It should be noted that support substrate 101 is not shown in FIG. 12b and only a portion of interconnect region is shown in FIG. 12b for simplicity.

In this embodiment, bonded semiconductor structure SRAM circuit 100a includes pull up transistor 115a. In this embodiment, however, pull up transistor 115a is bonded to interconnect region 150 with a dielectric bonding layer 199a which establishes a dielectric-to-dielectric bonding interface 158c therebetween. In particular, dielectric-to-dielectric bonding interface 158c is established between dielectric bonding layer 199a and dielectric material region 151.

As mentioned above, semiconductor layer 205a is wider than semiconductor layers 206a and 207a. In this embodiment, semiconductor layer 205a is wider than semiconductor layers 206a and 207a so that the area of dielectric-to-dielectric bonding interface 158c is increased so that the bonding strength is increased.

In this embodiment, control terminal 211a is connected to interconnect 195 and interconnect 195 is connected to interconnect 193 through via 194.

In this embodiment, semiconductor layer structure 205a is connected to an interconnect 225 through a via 226, and interconnect 225 is connected to interconnect 192 through via 162. It should be noted that via 226 extends upwardly from semiconductor layer 205a from a surface of layer 205a that faces control dielectric 210a and control terminal 211a. It should also be noted that via 164 extends between regions above and below dielectric-to-dielectric bonding interface 158c.

In this embodiment, bonded semiconductor structure SRAM circuit 100a includes pull up transistor 116a. In this embodiment, however, pull up transistor 116a is bonded to interconnect region 150 with a dielectric bonding layer 199b which establishes a dielectric-to-dielectric bonding interface 158d therebetween. In particular, dielectric-to-dielectric bonding interface 158d is established between dielectric bonding layer 199b and dielectric material region 151.

As mentioned above, semiconductor layer 205b is wider than semiconductor layers 206b and 207b. In this embodiment, semiconductor layer 205b is wider than semiconductor layers 206b and 207b so that the area of dielectric-to-dielectric bonding interface 158d is increased so that the bonding strength is increased.

In this embodiment, control terminal 211b is connected to interconnect 188 and interconnect 188 is connected to interconnect 192 through via 187.

In this embodiment, semiconductor layer structure 205a is connected to an interconnect 229 through a via 230, and interconnect 229 is connected to interconnect 193 through via 170. It should be noted that via 230 extends upwardly from semiconductor layer 205b from a surface of layer 205b that faces control dielectric 210b and control terminal 211b. It should also be noted that via 170 extends between regions above and below dielectric-to-dielectric bonding interface 158d.

In this embodiment, bonded semiconductor structure SRAM circuit 100a includes a pull up transistor 116a, which is similar to pull up transistor 116. In this embodiment, however, semiconductor layer 205b is wider than semiconductor layer 206b. Further, semiconductor layer 205b is wider than semiconductor layer 207b. Semiconductor layer 205b is wider than semiconductor layers 206b and 207b so that the area of bonding interface 158b is increased. The area of bonding interface 158b is increased so that the bonding strength is increased, as mentioned above.

In this embodiment, control terminal 211b is connected to interconnect 188 and interconnect 188 is connected to an interconnect 222. Interconnect 222 is connected to interconnect 192 through via 187.

Figure 13:
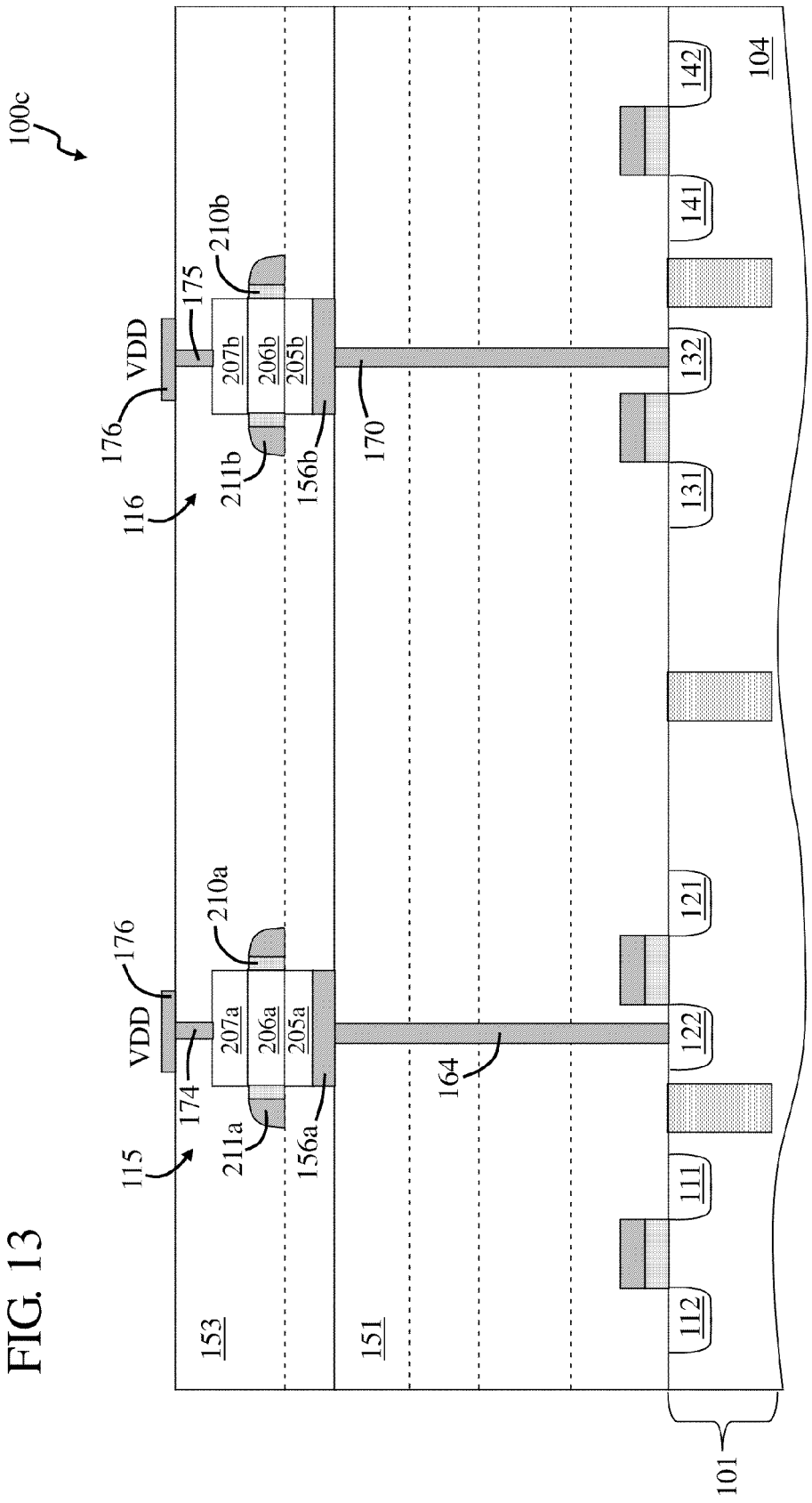

FIG. 13 is a side view of a bonded semiconductor structure static random access memory (SRAM) circuit, which is denoted as bonded semiconductor structure static random access memory circuit 100c. In this embodiment, bonded semiconductor structure SRAM circuit 100c includes support substrate 101, which carried dielectric material region 151. In this embodiment, bonded semiconductor structure SRAM circuit 100c includes pull up transistors 115 and 116, which extend through dielectric material region 153. Dielectric material region 153 is formed on dielectric material region 151, as described in more detail above. Pull up transistors 115 is bonded to dielectric material region 151 with conductive bonding contact region 156a. Pull up transistors 116 is bonded to dielectric material region 151 with conductive bonding contact region 156b. In this embodiment, conductive bonding contact region 156a is connected to drain 122 by via 164 and conductive bonding contact region 156b is connected to drain 132 by via 170.

The embodiments of the invention described herein are exemplary and numerous modifications, variations and rearrangements can be readily envisioned to achieve substantially equivalent results, all of which are intended to be embraced within the spirit and scope of the invention.

The invention claimed is:

1. A bonded semiconductor structure static random access memory circuit, comprising:
    a support substrate which carries a first horizontally oriented transistor, and an interconnect region which includes a conductive line; and
    a donor substrate which includes a semiconductor layer stack coupled to a donor substrate body region through a detach region, wherein the semiconductor layer stack is coupled to the interconnect region through a bonding interface, and wherein the semiconductor layer stack includes a pn junction.

2. The circuit of claim 1, further including a conductive bonding layer which extends between the interconnect region and stack of semiconductor layers.

3. The circuit of claim 2, further including a second horizontally oriented transistor carried by the support substrate, wherein the first and second horizontally oriented transistors are in communication with each other through the conductive bonding layer.

4. The circuit of claim 1, wherein a source and control terminal of the first horizontally oriented transistor are in communication with each other through the conductive bonding layer.

5. The circuit of claim 1, wherein the support substrate includes a single substrate well region per SRAM unit cell.

6. The circuit of claim 1, further including the detach region, wherein the detach region includes porous silicon.

7. A method of manufacturing a bonded semiconductor structure static random access memory circuit, comprising:
    providing a support substrate which carries a first type of transistor;
    providing a donor substrate which includes a semiconductor layer stack coupled to a donor substrate body region through a detach region, wherein the semiconductor layer stack includes a pn junction;
    coupling the semiconductor layer stack to the support substrate through a bonding interface; and
    processing the semiconductor layer stack to form a second type of transistor.

8. The method of claim 7, further including providing an interconnect region which is carried by the support substrate, the interconnect region having a conductive line.

9. The method of claim 7, further including providing the first and second types of transistors so they are NMOS and PMOS transistors, respectively.

10. The method of claim 7, further including providing the first and second types of transistors so they are in communication with each other through the bonding interface.

11. The method of claim 7, wherein the first and second types of transistors are horizontally and vertically oriented transistors, respectively.

12. The method of claim 7, further including forming a single substrate well region per SRAM unit cell.

13. The method of claim 7, further including separating the donor substrate from the semiconductor layer stack.

14. A bonded semiconductor structure static random access memory circuit, comprising:
    a support substrate which carries a first horizontally oriented transistor, and an interconnect region which includes a conductive line; and
    a first mesa structure coupled to the interconnect region through a first bonding interface, wherein the first mesa structure includes a pn junction.

15. The circuit of claim 14, further including a first conductive bonding contact region which extends between the interconnect region and first mesa structure.

16. The circuit of claim 15, further including a second horizontally oriented transistor, wherein the first and second horizontally oriented transistors are connected to the first conductive bonding contact region.

17. The circuit of claim 14, wherein the first mesa structure and first horizontally oriented transistor are in communication with each other through the first bonding interface.

18. The circuit of claim 14, further including a second mesa structure coupled to the interconnect region through a second bonding interface, wherein the second mesa structure includes a pn junction.

19. The circuit of claim 18, further including a second conductive bonding contact region which extends between the interconnect region and second mesa structure.

20. The circuit of claim 14, wherein the support substrate includes a single substrate well region per SRAM unit cell.

* * * * *